United States Patent
Pereira et al.

(10) Patent No.: US 10,491,157 B1
(45) Date of Patent: Nov. 26, 2019

(54) CRYSTAL OSCILLATOR ADAPTIVE STARTUP ENERGY MINIMIZATION

(71) Applicant: SILICON LABORATORIES INC., Austin, TX (US)

(72) Inventors: Vitor Pereira, Austin, TX (US); Tiago Marques, Austin, TX (US); Chester Yu, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/032,387

(22) Filed: Jul. 11, 2018

(51) Int. Cl.
| | |
|---|---|
| *H03B 5/06* | (2006.01) |
| *H03L 5/00* | (2006.01) |
| *H03L 3/00* | (2006.01) |
| *H03B 5/36* | (2006.01) |

(52) U.S. Cl.
CPC .......... *H03B 5/06* (2013.01); *H03B 5/36* (2013.01); *H03B 5/366* (2013.01); *H03L 3/00* (2013.01); *H03L 5/00* (2013.01); *H03B 2200/0094* (2013.01)

(58) Field of Classification Search
CPC ... H03B 5/36; H03B 5/06; H03B 5/32; H03B 2200/005; H03B 2200/0094; H03L 3/00; G06F 1/04; G06F 1/14
See application file for complete search history.

(56) References Cited

U.S. PATENT DOCUMENTS

| | | |
|---|---|---|
| 4,321,562 A | 3/1982 | Igarashi |
| 4,896,122 A | 1/1990 | Tahernia et al. |
| 4,956,618 A | 9/1990 | Ulmer |
| 5,041,802 A | 8/1991 | Wei et al. |
| 5,208,558 A | 5/1993 | Shigehara et al. |
| 5,416,445 A | 5/1995 | Narahara |
| 5,453,719 A | 9/1995 | Narahara |
| 5,900,787 A | 5/1999 | Yoshimura |
| 5,912,594 A | 6/1999 | Burkhard |
| 6,094,105 A | 7/2000 | Williamson |
| 6,097,257 A | 8/2000 | Kadowaki et al. |

(Continued)

OTHER PUBLICATIONS

Stephens, Ransom. "The Future of Multi-Clock Systems." Frequency Controls, Inc. 2007 pp. 1-14.

(Continued)

*Primary Examiner* — Ryan Johnson
(74) *Attorney, Agent, or Firm* — Gary Stanford

(57) ABSTRACT

An oscillation circuit including a crystal interface for coupling to a crystal, a crystal amplifier that drives the crystal to establish oscillation, a memory, a timing circuit, a level detector that provides an amplitude indication when an oscillation achieves a programmable threshold, and a controller. The controller applies one or more settings including gain and activates the crystal amplifier, measures the startup time, and calculates startup energy. The startup energy is based on a bias current of the crystal amplifier, remaining system current, and the startup time. The settings may include a gain setting of the crystal amplifier and one or more thresholds used by the threshold detector. The controller adjusts the settings for multiple startups, and determines optimal settings for minimizing the startup energy. The memory stores the optimal settings along with robust settings that may be used on a one-time basis in the event of startup failure.

20 Claims, 11 Drawing Sheets

(56) References Cited

U.S. PATENT DOCUMENTS

| | | | |
|---|---|---|---|
| 6,133,801 | A | 10/2000 | Tanaka |
| 6,653,908 | B1 | 11/2003 | Jones |
| 6,696,899 | B2 | 2/2004 | Ruffieux |
| 6,782,485 | B2 | 8/2004 | Takei |
| 6,873,215 | B2 * | 3/2005 | Devries .................. G06F 1/14 327/141 |
| 7,034,628 | B1 | 4/2006 | Lu et al. |
| 7,348,861 | B1 | 3/2008 | Wu et al. |
| 7,808,334 | B2 | 10/2010 | Yoshida et al. |
| 7,868,710 | B1 | 1/2011 | Farahvaash et al. |
| 7,961,060 | B1 | 6/2011 | McMenamy et al. |
| 8,324,978 | B2 | 12/2012 | Loeda |
| 8,395,456 | B2 | 3/2013 | Badillo et al. |
| 9,614,509 | B1 | 4/2017 | Ahmed |
| 9,647,670 | B2 * | 5/2017 | Viegas .................. H03L 3/00 |
| 2004/0169562 | A1 | 9/2004 | Novac |
| 2005/0017812 | A1 | 1/2005 | Ashida et al. |
| 2008/0211592 | A1 | 9/2008 | Gaussen |
| 2009/0002087 | A1 * | 1/2009 | Toffolon ................. H03L 3/00 331/186 |
| 2009/0096541 | A1 | 4/2009 | Tran |
| 2009/0121799 | A1 | 5/2009 | Ishikawa |
| 2011/0037527 | A1 | 2/2011 | Shrivastava et al. |
| 2011/0291767 | A1 | 12/2011 | Ishikawa et al. |
| 2012/0242418 | A1 | 9/2012 | Takahashi |
| 2013/0154754 | A1 | 6/2013 | Frank |
| 2014/0035689 | A1 | 2/2014 | Ozawa et al. |
| 2014/0091872 | A1 | 4/2014 | Itasaka |
| 2014/0320223 | A1 | 10/2014 | Ozawa et al. |
| 2016/0072438 | A1 | 3/2016 | Fukahori |
| 2019/0006990 | A1 | 1/2019 | Marques et al. |
| 2019/0006991 | A1 | 1/2019 | Marques et al. |
| 2019/0006992 | A1 | 1/2019 | Marques |
| 2019/0007005 | A1 | 1/2019 | Marques |
| 2019/0007012 | A1 | 1/2019 | Marques |

OTHER PUBLICATIONS

Marques, Tiago. Patent Application filed with the USPTO on Jun. 30, 2017 and receiving U.S. Appl. No. 15/639,038.

* cited by examiner

CRYSTAL OSCILLATOR ADAPTIVE STARTUP ENERGY MINIMIZATION

CROSS REFERENCE TO RELATED APPLICATION(S)

This application is related to the following U.S. Patent Application which is filed concurrently herewith and which is hereby incorporated by reference in their entireties for all intents and purposes.

| SER. NO. | FILING DATE | TITLE |
| --- | --- | --- |
| 16/032,348 | Jul. 11, 2018 | CRYSTAL OSCILLATOR STARTUP TIME OPTIMIZATION |

BACKGROUND OF THE INVENTION

Field of the Invention

The present invention relates in general to crystal oscillators, and more particularly to a system and method of adaptively minimizing startup energy of a crystal oscillator.

Description of the Related Art

An electronic device may operate in a sleep mode or other low power mode in order to save power when not performing normal operating functions. For example, a wireless device operating in certain wireless networks, such as Wi-Fi or Bluetooth or the like, operates in a sleep mode or other low power mode in order to save power when not communicating. The wireless device wakes up at certain intervals in order to transmit (TX) and/or receive (RX) information, and then goes back to sleep until the next RX/TX communication interval. Such systems typically use a crystal oscillator to establish a reference frequency. A crystal oscillator uses the mechanical resonance of a crystal to create an oscillation signal having a precise frequency. The crystal oscillator also includes a crystal amplifier that provides a "negative" resistance to cancel the losses of the crystal to establish and maintain oscillation. Upon each wake up event, the crystal oscillator is powered up in advance to achieve stable oscillation at the target reference frequency to enable communications (e.g., RX/TX communications) or other operations using the crystal oscillator at a scheduled time.

The startup time and startup energy of the crystal oscillator depends on the selected crystal and settings of parameters applied to the crystal amplifier driving the crystal. The physical properties may vary somewhat from one crystal to another and may vary widely for different crystal types or even among different manufacturers. A provider or manufacturer of a wireless transceiver semiconductor device or integrated circuit (IC) that incorporates the crystal amplifier may specify a set of allowed crystals or crystal types that may be used with the IC. Conventionally, in order to guarantee oscillation, a significant amount of laboratory time has been expended to test multiple crystal types from different manufacturers to identify a worst case startup time. The worst case startup time had to include a significant margin to account for crystal variations and process variations and well as operating condition variations, such as variations in voltage, current, temperature, etc. Thus, the worst case startup time incorporated a relatively wide margin of time, which resulted in higher energy consumption and lower battery life of the wireless device or any type of electronic device using the crystal oscillator. Targeting a specific crystal is also possible, but this is also time consuming and still has to account for temperature, IC (integrated circuit), and crystal part-to-part variations.

In a configuration in which the device wakes up and goes back to sleep on a regular basis during operation, the startup energy consumption may become a significant factor of the overall energy, resulting in higher energy consumption and lower battery life of any type of electronic device using the crystal oscillator, including wireless devices. In the conventional configuration, when it is further desired to minimize startup energy expenditure, a substantial amount of laboratory time has been expended to test each of the different crystal types to determine the values or settings of startup parameters to minimize startup energy.

SUMMARY OF THE INVENTION

An oscillation circuit according to one embodiment includes a crystal interface for coupling to a crystal, a crystal amplifier that is coupled to the crystal interface and that drives the crystal to initiate and maintain oscillation, in which the crystal amplifier has a gain input, a memory, a timing circuit, a level detector that provides an amplitude indication when an oscillation achieves a programmable threshold, and a controller. The controller activates the crystal amplifier and uses one or more settings including a gain setting to control the crystal amplifier, measures the startup time, and calculates startup energy. The startup energy is based on the bias current of the crystal amplifier, remaining system current (e.g., "other" current), and the startup time. The settings may include multiple settings for the gain of the crystal amplifier (e.g., bias current) and one or more thresholds used by the threshold detector in one or more sequenced startup phases. The controller adjusts one or more settings for each of one or more phases of multiple startups according to a selected search criterion, and determines optimal settings for minimizing the startup energy.

In a single phase embodiment, the controller adjusts the gain, calculates the corresponding energy, and compares the calculated energy with one or more previously calculated energy values to determine the settings that achieve minimum startup energy.

In a dual phase embodiment, the controller applies a first gain setting for a first startup phase for establishing oscillation, and applies a second gain setting for a second startup phase for achieving a target amplitude. The controller adjusts the first gain setting for each of successive startups to minimize startup energy of the first startup phase having a first startup phase time, and adjusts the second gain setting for each of the successive startups to minimize startup energy of the second startup phase having a second startup phase time. The controller may further adjust the intermediate threshold for each startup to minimize a total startup energy.

A multiphase embodiment is contemplated with 3 or more phases in which the gain settings are adjusted, corresponding startup phase times are measured, and corresponding minimum startup energy values are determined for each phase. The intermediate level detector thresholds may also be adjusted between each phase for further minimizing startup energy.

The controller may adjust the settings according to any suitable search method in which the startup energy for multiple startups are compared until one or more optimal settings are determined. An optimization algorithm, for example, may start from a previous known set of parameters either fixed in hardware or loaded from non-volatile memory or via a register interface or the like, in which case the optimization can start from a previous state or from a default state. Bounding conditions for the algorithm may also be provided which may be tailored for a specific application or a specific crystal.

The controller may measure multiple startup times and determine and store an optimal startup time used for calculating a wake up time for the oscillation system to wake up from a sleep mode in time to perform an operation at a scheduled time. The controller may remeasure and update the optimal startup time upon detecting a temperature change by a predetermined amount. The optimal startup time may be based on an average of startup values.

The controller may use a timing circuit or the like to detect when oscillation fails such that the amplitude indication is not provided within a predetermined timeout period. In the event of oscillation failure, the controller instead retrieves and applies robust settings from the memory to control activating the crystal amplifier for a single startup. In one embodiment, the robust settings are used at least once when oscillation failure is detected, and then operation returns to using the optimal settings.

An electronic device according to one embodiment includes a memory, a timing circuit, and an oscillation circuit. The oscillation circuit includes a crystal oscillator that establishes oscillation and that has a gain control input, a level detector that provides an amplitude indication when an amplitude at the crystal interface achieves a programmable threshold, and a controller. The controller provides a gain setting to the gain control input and activates the crystal amplifier, uses the timing circuit and the level detector to measure a new startup time of the crystal oscillator, calculates a startup energy based on the startup time, a bias current of the crystal oscillator and remaining system current, adjusts the gain setting for subsequent startups to determine at least one optimal setting that minimizes startup energy, and stores the at least one optimal setting in the memory.

The controller may adjust the gain setting for each of multiple startups, calculate corresponding energy values, and compare the energy values for determining a bias current that minimizes startup energy.

The gain setting may include a first gain setting applied during a first startup phase for establishing oscillation and a second gain setting applied during a second startup phase for achieving a target amplitude. The controller may adjust the first gain setting for successive startups to minimize startup energy of the first startup phase having a first startup phase time, and may adjust a second gain setting for the successive startups to minimize startup energy of the second startup phase having a second startup phase time.

The controller may further program the threshold of the level detector to an intermediate threshold for the first startup phase, and may program the threshold to a target threshold for the second startup phase, in which the controller adjusts the intermediate threshold for each of successive startups to minimize a total startup energy.

The electronic device may include a processor that programs a wakeup circuit with a wakeup value based on a scheduled communication session time and an adjusted startup time, in which the controller determines the adjusted startup time based on multiple new startup times.

In the event that the amplitude indication is not provided within a predetermined timeout period, the controller may retrieve robust settings stored in the memory and apply the robust settings to control activating the crystal amplifier for at least one startup before returning to optimal settings.

A method of minimizing startup energy of a system that uses a crystal oscillator according to one embodiment includes adjusting the gain level of the crystal oscillator, measuring a startup time from activation of the crystal oscillator to when an indication is provided indicating that an oscillation signal of the crystal oscillator achieves a target amplitude, calculating a startup energy of the system based on a bias current level of the crystal oscillator, the startup time, and an "other" current level representing an amount of remaining current of the system other than the bias current, repeating the adjusting, the measuring, and the calculating for multiple startups to provide multiple startup energy values, and comparing each newly calculated startup energy value with at least one previously calculated startup energy value until an optimal bias current level is determined that achieves a minimum startup energy of the system.

The method may include adjusting the gain level for each of multiple startup phases of each of multiple startups, setting a threshold of a level detector between each phase, measuring a duration of phase for each startup, calculating a startup energy phase value of each phase of each startup based on a phase bias current level, a phase startup time, and the other current level, and comparing each newly calculated startup energy phase value with at least one previously calculated startup energy phase value of a corresponding phase until optimal phase gain levels are determined that achieve a minimum phase energy for each startup phase.

After determining the optimal phase gain levels, the method may further include adjusting the threshold of a level detector between each phase, repeatedly restarting the crystal oscillator using the optimal phase gain levels for the startup phases and the adjusted thresholds between the phases, adding the startup phase energy values for each startup to determine a startup energy value for each startup, and comparing each newly calculated startup energy value with at least one previously calculated startup energy value until optimal thresholds are determined that achieve a minimum startup energy of the system.

The method may further include measuring multiple startup times, using the startup times to determine an adjusted startup time, storing the adjusted startup time, and using the stored startup time to determine a delay value for programming a wakeup circuit.

The method may further include detecting when the crystal oscillator fails to startup using one of default settings, adjusted settings, and optimal settings, and reactivating the crystal oscillator using robust settings when the crystal oscillator fails to startup.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The inventors have recognized the need to minimize the startup energy consumption of a crystal oscillator used in an electronic device or system, such as, for example, a system using a wireless device that periodically wakes up from a sleep mode to perform communication functions. The crystal amplifier driving the crystal is initially activated with default settings to establish oscillation, and the corresponding startup energy of the system using the crystal oscillator is measured. The energy is determined based on the startup time and the total current of the system in which the total current includes a core bias current used within the crystal amplifier. The controller adaptively adjusts the gain of the crystal amplifier, among other parameters for each of subsequent startups and measures the corresponding energy, and determines the optimal settings of each of the parameters that establishes a minimum startup energy. Once determined, the optimal settings may be stored and used for subsequent startups to maintain minimal startup energy of the system.

The inventors have also recognized that the optimal settings may be insufficient to startup a crystal oscillator with a "sleepy" crystal. In the event of failure of startup of the crystal oscillator, robust settings are used instead to startup the crystal oscillator. It is also observed that once a crystal oscillator is energized into oscillation, it no longer exhibits sleepy characteristics so that the optimal settings may once again be used for subsequent startup events.

Figure 1:
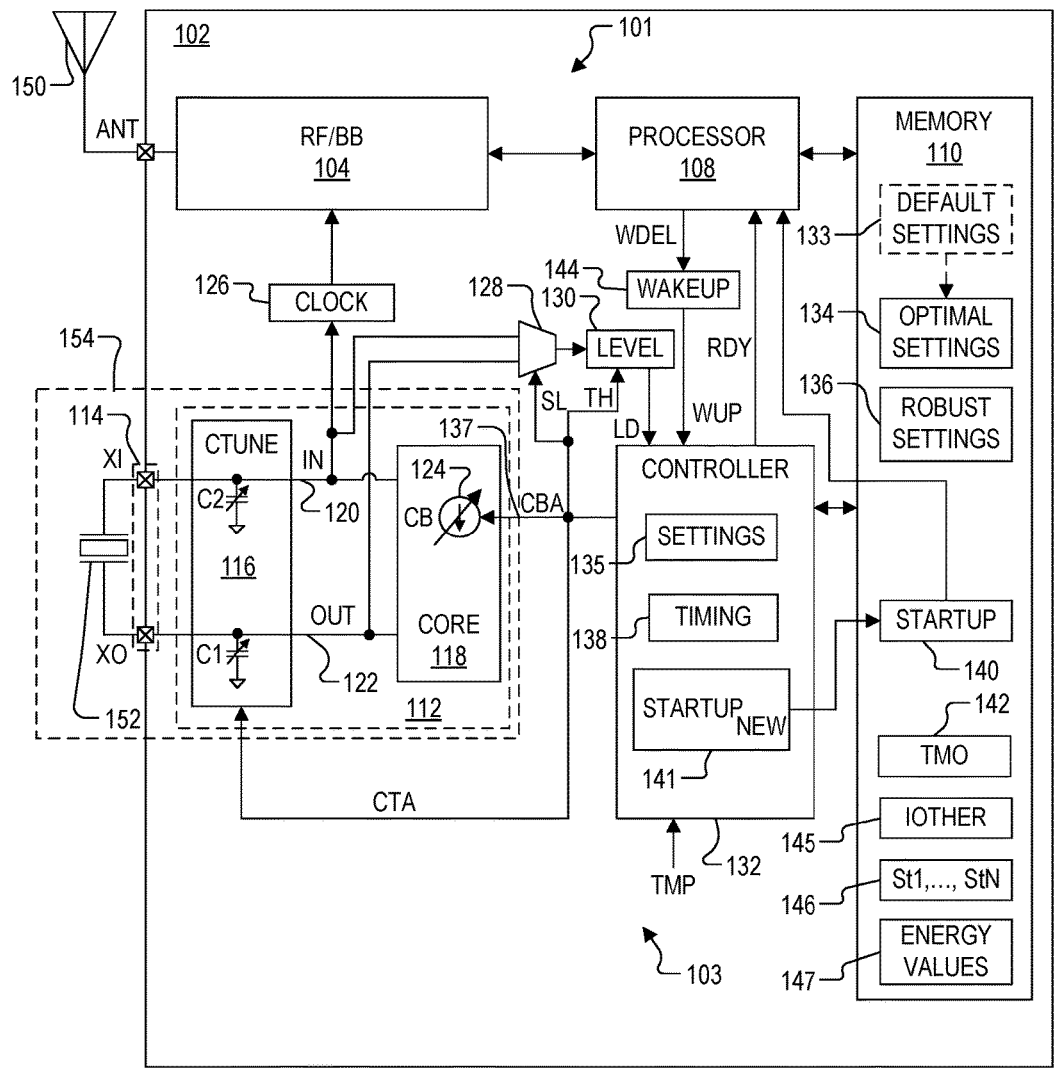
FIG. 1 is a simplified block diagram of a wireless device including a wireless circuit that is capable of optimizing the startup energy of a crystal oscillator for wireless communications according to one embodiment.

FIG. 1 is a simplified block diagram of a wireless device 100 including a wireless circuit 102 that is capable of minimizing the startup energy of a crystal oscillator 154 for wireless communications according to one embodiment. The wireless circuit 102 adaptively determines optimal settings of startup parameters for minimizing startup energy. The wireless circuit 102 may further measure multiple startup times during subsequent startups using the optimal settings to determine and store an optimal startup time that minimizes subsequent wakeup time durations. The wireless device 100 is shown in generalized form for any of various wireless communication configurations, such as Bluetooth®, Zigbee, Wi-Fi, etc. Other functional circuit blocks and circuits may be included for particular applications, but are not shown as not necessary for a full and complete understanding of the present invention. The wireless circuit 102 may be implemented on an integrated circuit (IC) or semiconductor chip or the like, in which the wireless circuit 102 and other components of the wireless device 100 may be mounted on a printed circuit board (PCB) (not shown), a module (not shown), or the like as part of an electronic system.

The wireless device 100 may be included within an electronic device or system according to any one of various platforms, such as a communication device (hand-held, mobile, stationary, etc.), a computer system (laptop, desktop, server system, etc.), a computer peripheral device (e.g., printer, router, etc.), or any other system or device that may be networked together via wired and/or wireless communications. The present disclosure contemplates the use of the wireless device 100 incorporated within a system that may be part of a suite of components of an Internet of Things (IoT) platform or the like. The components or devices may be powered from an external source (e.g., AC outlet or the like), may be powered by one or more rechargeable or non-rechargeable batteries or battery cells, or may be powered by alternative sources, such as harvested energy, e.g., solar, piezoelectric, biochemical, thermal, etc.

Although the present invention is illustrated for use within a wireless communication system, it is understood that the present invention is not limited to wireless communications and may be used in any electronic device or application that uses a crystal oscillator that is repeatedly turned off and turned back on during normal operation. In the illustrated configuration, the wireless circuit 102 includes a communication system 101 and an oscillation system 103 provided on the same semiconductor chip or IC, though it is understood that the oscillation system 103 may be provided on a separate chip or IC and used in other types of electronic devices using a crystal oscillator (e.g., the crystal oscillator 154). The wireless circuit 102 may include other supporting circuitry not shown, such as power circuitry or the like generally providing support for either or both the communication system 101 and the oscillation system 103.

The wireless device 100 includes the wireless circuit 102, an antenna 150, and a crystal 152, and any other supporting circuitry (not shown). The wireless circuit 102 includes an antenna pin ANT (or other appropriate antenna interface) configured for coupling to the external antenna 150, and a radio frequency and baseband (RF/BB) circuit 104 internally coupled to the antenna pin ANT. The RF/BB circuit 104 is configured to convert digital baseband signals from the processor 108 to RF for transmitting RF signals via the antenna 150, and for converting RF signals received via the antenna 150 into digital baseband signals provided to the processor 108. Although not specifically shown, the RF/BB circuit 104 incorporates analog to digital conversion (ADC)

and digital to analog conversion (DAC). Each such receive (RX) and/or transmit (TX) operation is performed during a communication session. A memory 110 is included and coupled to the processor 108. The communication system 101 generally includes the RF/BB circuit 104 with input/output (I/O) coupled via the antenna pin ANT, the processor 108 and the memory 110.

The memory 110 may include any combination of volatile and non-volatile memory for storing data and information, including, for example, various programmable settings, values or parameters. The volatile memory portion of the memory 110 may include, for example, a random access memory (RAM) or the like including registers and the like that may be programmed on the fly during operation for storing run-time data or the like. Information stored in the volatile memory portion (e.g., RAM) is generally lost when power is removed. The non-volatile memory portion of the memory 110 may include, for example, a read-only memory (ROM) or the like that stores permanent information, such as boot-up or run-time routines and values or the like that do not change during operation or when power is removed. The non-volatile memory portion of the memory 110 may also include FLASH memory or the like that stores non-volatile data and information that may be reprogrammed during operation and is not lost when power is removed. The memory 110 is shown at a central location, where it is understood that the memory 110 may include different types of memory distributed in convenient and accessible locations of the wireless circuit 102.

The particular details of operation of the wireless communications are not further described, other than a "sleep" mode or other low power mode, wakeup and activation, and wireless communication scheduling. The wireless circuit 102 is configured to operate in a sleep mode between sequential communication sessions to conserve power. During operation, the wireless device 100 may negotiate with one or more external wireless devices (not shown) in a wireless network via a handshaking protocol or the like, or simply operate according to a predetermined protocol without negotiation. In either case, subsequent RX/TX wireless communications are scheduled ahead of time. The processor 108 may execute a routine or application or the like for scheduling communications (or other operations), or such communications may be scheduled by an external controlling device in the system (not shown) that prompts the processor 108. In the illustrated embodiment, once the next communication session is scheduled, the wireless circuit 102 may be powered down into its sleep mode and remain in sleep mode until the next scheduled communication session. The wireless circuit 102 is awakened sufficiently ahead of time to enable it to perform wireless communications at the next scheduled communication session time, and is placed back into sleep mode after the current communication session has completed and the next communication session is scheduled. It is understood that it is desirable for the wireless circuit 102 to remain in its sleep mode for as long as possible to conserve as much power as possible, but without substantially impacting wireless communications.

The oscillation system 103 of the wireless circuit 102 includes a crystal amplifier 112, a crystal interface 114, a select circuit 128, a level detector 130, a controller 132, and the memory 110. The controller 132 is shown as a separate functional block in the illustrated embodiment, although the control functions may instead be distributed or even part of a larger control function in the system. The memory 110 may be shared with the communication system 101 or separate memory systems may be provided. The crystal interface 114 enables external coupling of the crystal 152 to the oscillation system 103. As shown, the crystal interface 114 includes an amplifier input pin XI and an amplifier output pin XO, in which the crystal 152 includes a pair of terminals externally coupled between XI and XO. It is noted that the crystal amplifier 112 and the crystal 152 are collectively referred to as the crystal oscillator 154. The crystal amplifier 112 includes a tuning capacitor (CTUNE) circuit 116 and an amplifier core 118, which are both coupled to an amplifier input node 120 developing a signal IN and an amplifier output node 122 developing a signal OUT.

The CTUNE circuit 116 includes a first adjustable capacitor C1 coupled between the amplifier output node 122 and a reference node and a second adjustable capacitor C2 coupled between the amplifier input node 120 and the reference node. The reference node develops a suitable positive, negative or zero reference voltage level, such as ground (GND). The capacitance of the capacitors C1 and C2 may be adjusted based on a capacitance adjust value CTA provided by the controller 132 to an adjust input of the CTUNE circuit 116. The amplifier core 118 includes an adjustable current source 124 which develops a core bias (CB) current based on a core bias adjust (CBA) value provided by the controller 132 to its adjust input as further described herein.

The crystal oscillator 154, when activated by the controller 132, develops an oscillation signal at the crystal interface 114 including both the input and output pins XI and XO and also at both the amplifier input and output nodes 120 and 122. In the illustrated configuration, the amplifier input node 120 is coupled to the input of a clock circuit 126, and the clock circuit 126 uses the oscillation signal to develop one or more clock signals to the RF/BB circuit 104 for enabling wireless communications. It is noted that the amplifier output node 122 may instead be used to provide the oscillation signal to the input of the clock circuit 126. The clock circuit 126 may include additional circuitry (not shown) for developing the clock signals used by the RF/BB circuit 104, such as a squaring buffer, a level shifter, inverters, selectors, buffers, etc. It is understood that the oscillation signal develops a reference frequency having sufficient accuracy along with noise and power supply rejection ratio (PSR) performance to develop the one or more clock signals used for wireless communications.

The amplifier input and output nodes 120 and 122 are further coupled to respective inputs of the select circuit 128, having an output providing a selected signal to an input of the level detector 130. The level detector 130 outputs a level detect (LD) signal to an input of the controller 132. The select circuit 128 may be implemented as a multiplexer (MUX) or the like receiving a select signal SL from the controller 132 for selecting between XI and XO. The level detector 130 may be implemented as a peak detector, an amplitude detector, a signal level detector for determining the root-mean-square (RMS) level of an input voltage level, an envelope detector, etc. It is noted that the level detector 130 may incorporate the select circuit 128 and receive SL for selecting between XO or XI. Alternatively, the select circuit 128 may be omitted altogether for embodiments in which only XI or XO is monitored. In one embodiment, the level detector 130 asserts LD when a level of a selected one of the amplifier input and output nodes 120 and 122 (or XI and XO) reaches a level threshold determined by a threshold value TH provided by the controller 132. The controller 132 is also coupled to the memory 110 for reading and writing data and information in a similar manner as the processor 108.

The crystal amplifier 112 establishes and maintains oscillation of the crystal 152 by generating the appropriate level of negative resistance between XO and XI (coupled across the crystal 152) to develop the oscillating signal, which generally has a sinusoidal waveform. The memory 110 includes a group of default settings 133, a group of optimal settings 134, and a group of robust settings 136. The controller 132 may include an internal settings memory 135 for storing settings retrieved from the memory 110. Each group of settings includes one or more settings for operating parameters applied to the crystal amplifier 112 to establish oscillation of the crystal oscillator 154. Each group of settings may include, for example, one or more CBA values for adjusting the core bias current developed by the current source 124, one or more CTA values for adjusting the tune capacitors C1 and C2 of the CTUNE circuit 116, one or more TH values used by the level detector 130 for monitoring the amplitude of the oscillation signal, etc. In the illustrated embodiment, the controller 132 controls SL to monitor XO or XI in order to monitor the amplitude of the oscillation signal, and may further adjust TH accordingly. In one embodiment, XO is monitored first until oscillation is detected, and then XI is monitored to establish and maintain a final target amplitude of the oscillation signal. In an alternative embodiment, only one of XO or XI is monitored during the entire startup process.

In a more specific embodiment, the controller 132 may be implemented as a digital state machine or the like which adjusts the crystal amplifier 112 by providing and updating digital code values to various components. Although the controller 132 is shown embodied within a single block, its control functions may be distributed into multiple sub-blocks or the like. The digital code values are adjusted by the controller 132 during sequential startups. For example, CBA may be a digital code value provided to the current source 124, which adjusts the core bias current accordingly. Similarly, CTA may include at least one or two separate digital code values, including a first digital code for adjusting the capacitance of C1 and a second digital code for adjusting the capacitance of C2. In one embodiment, the capacitors C1 and C2 may each be implemented as multiple capacitors and corresponding switches (not shown) in which the corresponding digital control values control the switches to select a corresponding capacitance.

In one embodiment, the level detector 130 may be implemented as a peak detector, which may further be implemented as an envelope tracker (not shown), a simple comparator (not shown) and a digital-to-analog converter (DAC) or the like (not shown) that converts the selected input with a selected comparison threshold TH from the controller 132. The comparison threshold TH may also be in the form of a digital code value or the like. As described further herein, several thresholds may be defined (e.g., TH1, TH2, etc.), and each may be programmed into the settings memory 135 accessible by the level detector 130 for setting its threshold for comparison. The level detector 130 accesses and selects the applicable threshold provided as TH, and the comparator compares the input with the selected threshold and asserts LD as a digital output when the threshold is reached.

The crystal amplifier 112 may include additional components that are adjustable by the controller 132. For example, the crystal amplifier 112 may include a voltage regulator (not shown), in which the controller 132 provides a digital code value to adjust a voltage applied to the amplifier core 118. Also, the crystal amplifier 112 may include a high gain amplifier (not shown) that provides additional gain to the core bias current CB. An example of an additional high gain amplifier is shown and described in U.S. patent application Ser. No. 15/639,038, filed Jun. 30, 2017, entitled "Crystal Amplifier With Additional High Gain Amplifier Core To Optimize Startup Operation." Many of these additional adjustable components may be adjusted in the same manner during each startup and otherwise not changed. For example, when the crystal amplifier 112 is initially activated, the controller 132 activates the high gain amplifier, slightly increases the voltage of the voltage regulator, and decreases the capacitance of either or both of the adjustable capacitors C1 and C2. When oscillation is detected and before reaching its final amplitude, the high gain amplifier is deactivated (or simply disconnected), and the voltage and capacitance are switched to final values for steady state operation.

As noted above, the controller controls the CBA value to adjust the core bias current CB of the crystal amplifier 112, which is used to adjust the gain of the crystal amplifier 112. The gain of the crystal amplifier 112 modifies the level of negative resistance that is applied to the crystal 152 to establish and maintain oscillation of the crystal oscillator 154. In this manner, for the illustrated configuration used throughout this disclosure, the CBA value serves as a gain setting applied to a gain control input 137 of the crystal amplifier 112 for adjusting amplifier gain. As further described herein, the core bias current determined by CBA is also used for calculating startup energy. Alternative crystal oscillator configurations, however, are contemplated. Another possible implementation, for example, is to bias a crystal amplifier with a bias voltage and adjust the gain by adjusting the bias voltage. In a configuration where the gain is controlled by voltage, however, the core bias current will be separately measured, or somehow estimated, to calculate the startup energy, since the bias current is not controlled. Therefore, the use of a controlled bias current to adjust the crystal amplifier gain is particularly advantageous since it also readily provides the bias current level used for calculating startup energy.

Upon the very first POR of the wireless device 100, the optimal settings 134 may include settings that are not initially "optimal" from a startup energy standpoint. Also, the default settings 133 are shown with a dashed line meaning that the default settings may not be provided in a separate memory location. In one embodiment, the optimal settings 134 may initially be loaded with the default settings 133 as indicated by an arrow. Alternatively, the default settings 133 may be permanently stored and copied into the optimal settings 134 as a one-time event during a first startup. It is noted that different sets of default settings 133 may be provided for different crystals or crystal types. In an alternative embodiment, the default settings 133 may be provided externally via register or memory writes.

The default settings 133 are selected as initial or mid-level settings that may be sufficient to establish oscillation under normal circumstances, but are not optimized to minimize startup energy. The default settings 133 may be determined with a minimal amount of experimentation to ensure successful startup. The default settings 133 are used as the "optimal" settings for a first startup to establish a baseline energy calculation. During subsequent startups, the controller 132 adjusts one or more of the settings during subsequent startups according to a selected routine, and then measures and compares energy consumption with previous energy calculations. Over time for multiple startups, the controller 132 eventually converges on the particular "optimal" settings in which a minimal amount of startup energy is consumed, and these settings are then stored as the optimal settings 134 and used thereafter for normal startups. The final optimal settings 134 may be stored, for example, in a FLASH memory or the like and used indefinitely thereafter to minimize startup energy.

The default settings 133 and the robust settings 136 may be determined beforehand for each of multiple crystals and crystal types that may be used by the wireless circuit 102. These settings may be provided to the wireless circuit 102 via a memory or register write or the like, which allows a user to tailor the behavior of the crystal oscillator 154 with some settings targeted for a given crystal if desired. The default settings 133 are generally selected to ensure oscillation for the particular crystal or crystal type, such as providing a mid-level of core bias current necessary to establish and maintain oscillation. The default settings 133 and the optimal settings 134, once determined and finalized, may be not be sufficient to startup a "sleepy" crystal. In one embodiment, the amplifier core 118 may be optimized for a 40Ω crystal (normally having a maximum equivalent series resistance (ESR) of 40Ω). A sleepy crystal, however, may, temporarily, exhibit up to 5 times or more of the maximum ESR, such as up to 200Ω. The robust settings 136 are used when the crystal oscillator 154 fails to startup using the default and/or optimal settings. The robust settings 136 establish a greater level of negative resistance for starting up a sleepy crystal, such as increased level of core bias current, reduced capacitance of the tune capacitors C1 and C2, etc.

In a conventional configuration, rather than using optimal settings for efficient startup, settings similar to the robust settings have been used instead to ensure startup of a sleepy crystal. It has been determined, however, that a crystal becomes sleepy only once for a large number of startups, so that using more robust settings for every startup wastes significant energy. Instead, in one embodiment the optimal settings 134 (starting as default that are eventually adjusted to optimal) are used for every startup. In the event of a startup failure due to a sleepy crystal, the crystal is restarted again using the robust settings 136 which may resolve the condition with little loss of performance over time. It is noted that the optimal settings 134 and/or the robust settings 136 may be adaptively adjusted as further described herein.

The controller 132 includes a timing circuit 138 for measuring a new startup time $STARTUP_{NEW}$. In one embodiment, the timing circuit 138 may be implemented based on the internal timing functions of the controller 132. Alternatively, the timing circuit 138 may be implemented as a separate circuit from the controller 132. As described further herein, the controller 132 uses the timing circuit 138 to determine elapsed startup time, and the controller 132 monitors LD from the level detector 130 to determine when the amplitude of the oscillation signal generated by the crystal oscillator 154 reaches a target level. Once the target level is reached, the controller 132 determines a new startup value $STARTUP_{NEW}$ from the timing circuit 138. Although shown within the controller 132, the $STARTUP_{NEW}$ value may be stored into a register 141 located in the memory 110. As further described herein, the controller 132 uses $STARTUP_{NEW}$ to update a previously stored STARTUP value at a memory location 140 within the memory 110, or may otherwise adjust a first new startup value $STARTUP_{NEW}$ to be stored as the first STARTUP value stored at the memory location 140. The controller 132 asserts a ready signal RDY to the processor 108 when the crystal oscillator 154 is oscillating at the target amplitude and is stable. The stored STARTUP value at memory location 140 is used by the processor 108 for timing subsequent startups as further described herein. The total startup time may occur in a single phase, or may be divided into two or more phases in which the timing circuit 138 is used to measure separate startup phase times St1, St2, etc., as further described herein.

In one embodiment, a timeout value (TMO) may be stored at another memory location 142 in the memory 110 and used by the controller 132 to identify startup failure using the optimal settings 134. Alternatively, TMO may be hardcoded into the timing circuit 138 or provided externally. TMO represents an excessive amount of time indicating that the crystal oscillator 154 has failed to startup. If TMO is reached before LD is asserted indicating oscillation failure, then the controller 132 retrieves the robust settings 136 and attempts to restart the crystal oscillator 154 using the robust settings 136. Once started, the controller 132 retrieves and stores the optimal settings 134 back into the settings memory 135 as the default startup settings for subsequent startup events.

In one embodiment, the wireless circuit 102 further includes a wakeup (WAKEUP) circuit 144 that is programmed by the processor 108. As shown, the processor 108 programs the WAKEUP circuit 144 with a wakeup delay value WDEL. WDEL is based on the next scheduled startup time and further based on STARTUP determined by the processor 108. The WAKEUP circuit 144 asserts a wakeup signal WUP to wake up the wireless circuit 102, in which WUP is provided to the controller 132. The wakeup circuit 144 may be implemented as a timer circuit or the like that asserts WUP based on the wakeup delay WDEL programmed by the processor 108. Although WUP is shown provided by the WAKEUP circuit 144 directly to the controller 132 for simplicity, it may instead be provided to the power controller or power sequencer which in turn wakes up components of the wireless circuit 102 including the processor 108 and the controller 132.

The memory 110 may also store a value IOTHER at a storage location 145. IOTHER represents the remaining current of the wireless device 100 other than the core bias current CB, in which IOTHER may be previously determined and stored. In alternative embodiments, IOTHER may be measured or otherwise inferred from other system settings. IOTHER may also include current of a larger system in which the wireless device 100 for a more comprehensive energy calculation. In this manner, the total current of the wireless device 100 or electronic system is IOTHER+CB. The memory 110 may further store one or more time values for each of the startup phase times St1, . . . , StN (for up to N startup phase times in which N is 2 or more) as described further herein at a memory location 146 for the dual phase embodiment. In addition, the memory 110 may store one or more calculated energy values at a memory location 147. The controller 132 may use IOTHER, the core bias current and the total startup time STARTUP to calculate a total startup energy value that may be stored at a memory location 147 or otherwise compared to previously stored energy values. In another embodiment, the controller 132 may use IOTHER, the core bias current for each phase and the startup phase times St1-StN to calculate startup energy values for each phase that are stored at the memory location 147 or otherwise compared to previously stored energy values. The controller 132 performs the energy comparisons to find the optimal settings 134 that achieve a minimum startup energy as further described herein.

The controller 132 may update the STARTUP value stored at memory location 140 according to any one of several different methods as further described herein. In one implementation, STARTUP is determined once during a first boot or POR and used thereafter for subsequent startups. In other implementations, STARTUP is periodically updated, such as after each startup or after every Nth startup in which N is programmable, so that STARTUP is adjusted over time. In other implementations, STARTUP is determined and used for subsequent startups and only adjusted when the temperature changes by a significant amount. As shown, a temperature value TMP is provided so that the controller 132 may monitor the temperature and temperature changes over time. TMP may be provided by a local temperature sensor (not shown) or may be provided from an external source.

Figure 2:
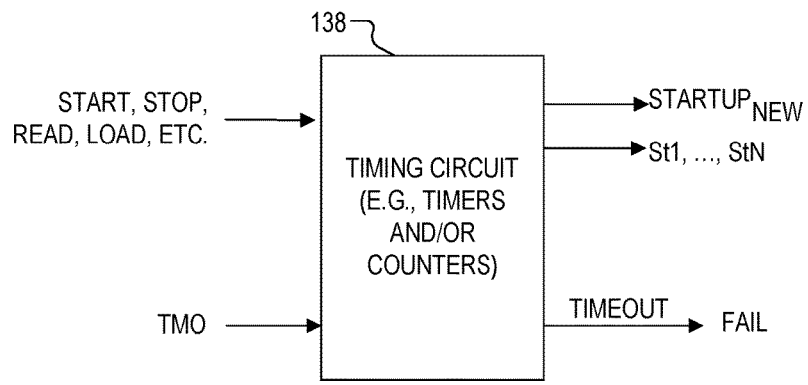
FIG. 2 is a block diagram illustrating a configuration of the timing circuit for measuring a new startup time and operation of the controller of FIG. 1 for updating a stored STARTUP value according to one embodiment.

FIG. 2 is a simplified block diagram illustrating a configuration of the timing circuit 138 according to one embodiment. The illustrated timing circuit 138 may include one or more timers and one or more counters or the like such as is common in digital circuits. The timing circuit 138 may be used for measuring elapsed time, such as a new startup time $STARTUP_{NEW}$ or the duration of each of one or more startup phase times St1, ..., StN (in which N denotes the number of startup phases for a multiphase configuration). To facilitate measuring elapsed time, the controller 132 may issue one or more commands to the timing circuit 138, such as START, STOP, READ, LOAD, etc., such as starting a timer or counter upon activation of the of the crystal oscillator 154 and stopping or reading the value in the timer or counter in response to assertion of LD or the like. Each newly measured $STARTUP_{NEW}$ value may be stored into the register 141 and used to update STARTUP stored at the memory location 140. The timing circuit 138 may be used to identify startup failure, such as by loading TMO into a countdown timer or the like which times out and asserts a FAIL signal indicating failure of oscillation since oscillation is not achieved within the maximum allowed time period TMO. As previously described, TMO may instead be a hardwired value in the timing circuit 138 or externally provided. The configuration of the timing circuit 138 is exemplary only and many different configurations for measuring time periods are contemplated.

Figure 3:
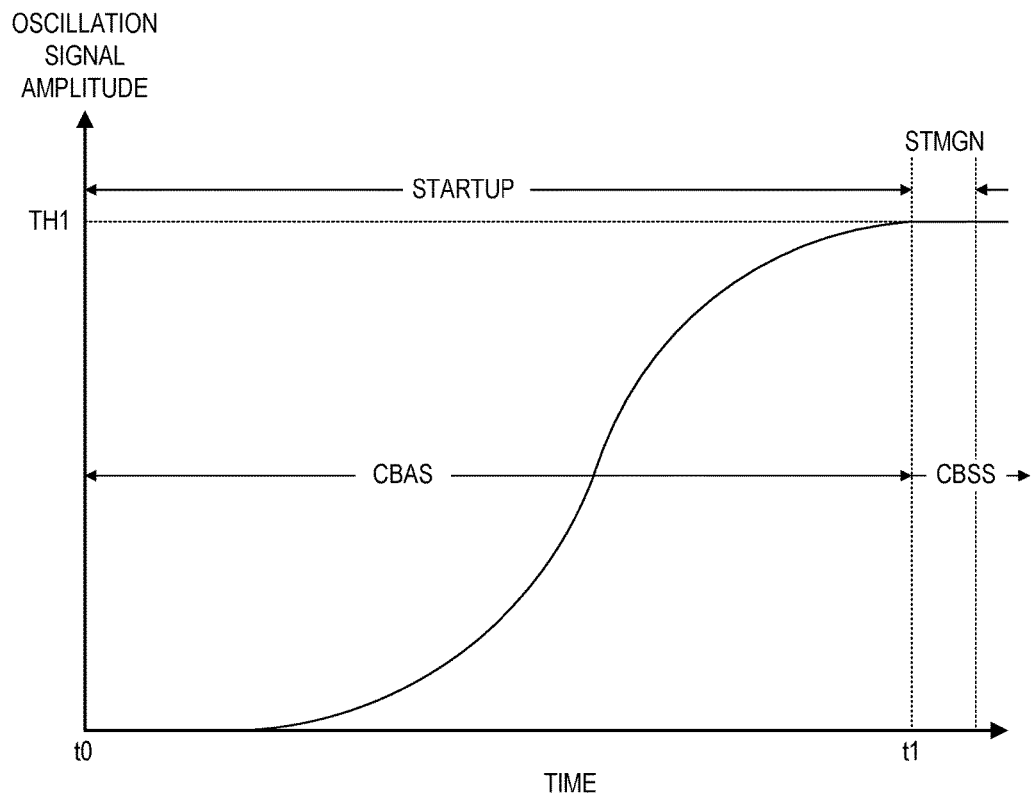
FIG. 3 is an idealized timing diagram plotting the amplitude of the oscillation signal versus time during startup of the crystal oscillator of FIG. 1 for a single phase configuration.

FIG. 3 is an idealized timing diagram plotting the amplitude of the oscillation signal versus time during startup of the crystal oscillator 154 for a single phase configuration. The units of amplitude and time are not specifically shown since the amplitude curve generally represents many different configurations or implementations. At an initial time t0, the controller 132 activates the crystal oscillator 154 and asserts oscillation parameters at selected settings. For example, the controller 132 adjusts the CBA value to a selected value CBAS causing the current source 124 to provide an initial level of core bias current, which may be a relatively high level of core bias current. AS previously noted, CBA is used as a gain setting to adjust the gain of the crystal amplifier 112. Although not specifically shown, the controller may also adjust the CTA value(s) to reduce the capacitance of one, or both, of the tune capacitors C1 and C2, and to elevate the voltage applied to the amplifier core 118. The controller 132 can assert SL to monitor XI (or the IN signal asserted on the amplifier output node 120) and the threshold value TH is set to a final target amplitude level TH1. It is noted that the controller 132 may instead monitor XO until it reaches TH1.

Assuming normal operation, the crystal oscillator 154 begins to oscillate and the oscillation signal on XI (and XO) begins to increase. When the amplitude of the oscillation signal reaches the target level TH1 at a subsequent time t1, the level detector 130 asserts LD and the controller 132 adjusts the CBA value to a steady state level CBSS. After switching to CBSS, the oscillation signal stabilizes to its final frequency and amplitude. Although the stabilization period may vary somewhat, a predetermined fixed stabilizing time margin period STMGN may be added after time t1 to ensure stabilization of the oscillation signal before assertion of RDY. CBSS may be a relatively low core bias current sufficient to sustain oscillation at the target amplitude. It is noted that the initial setting for CBSS may be a default value which may or may not achieve the desired target amplitude. In one embodiment, the controller 132 may further perform an automatic gain control (AGC) process or the like during an initial startup and periodically thereafter, or in response to some other trigger, such as a significant change in temperature, to adjust CBSS to achieve the target amplitude for steady state operation.

Figure 4:
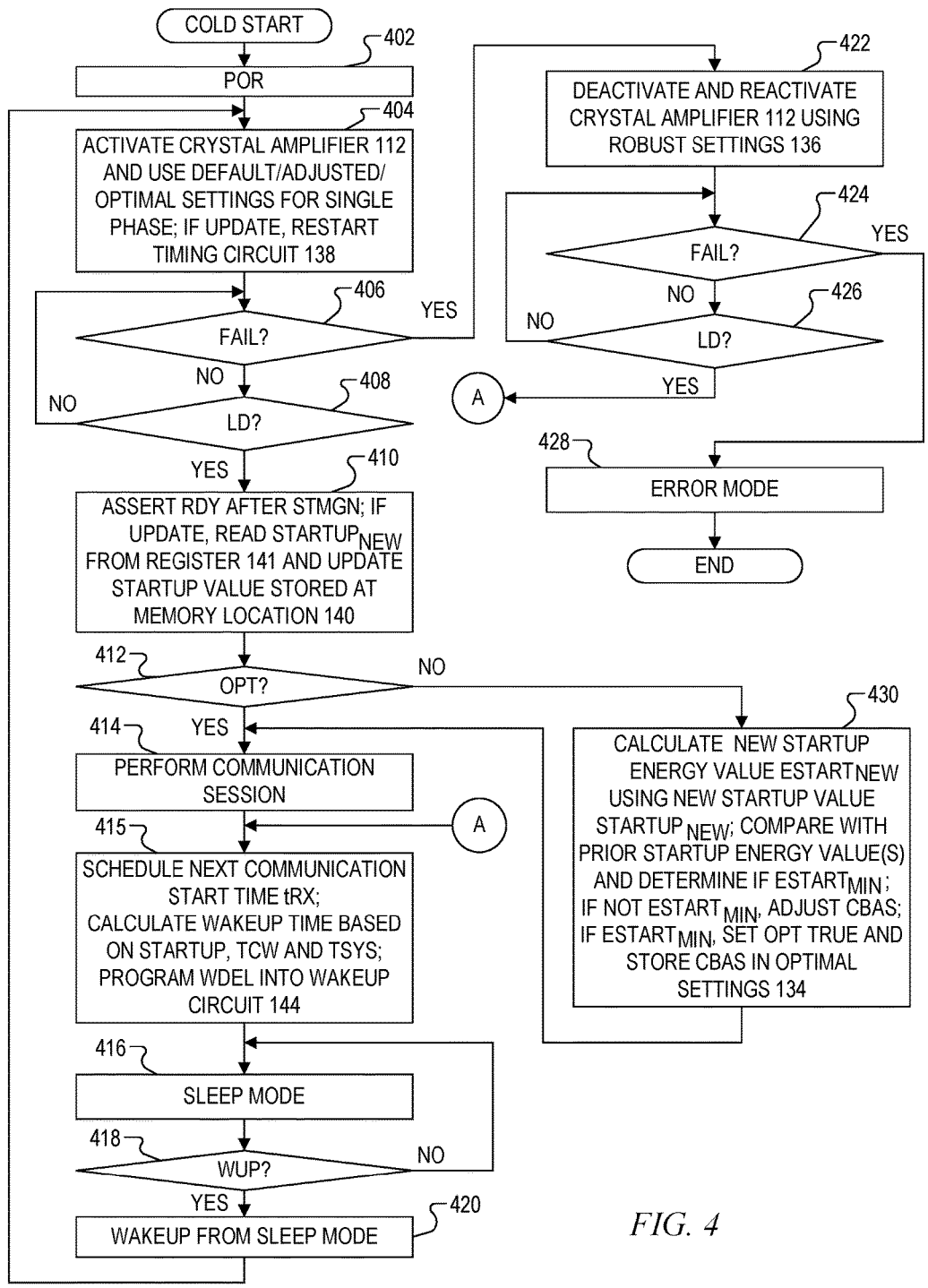
FIG. 4 is a flowchart diagram illustrating operation of the wireless device of FIG. 1 according to a single phase embodiment.

FIG. 4 is a flowchart diagram illustrating operation of the wireless device 100 according to a single phase embodiment. Operation begins with a "cold" start at block 402 upon initial power up or reset (POR) of the wireless circuit 102. The processor 108 may perform an initialization or boot-up routine and then transition to a normal operating routine or application. The controller 132 may also be powered up and initialized, which may include retrieving and storing the optimal settings 134 into the settings memory 135. As previously described, the initial values of the optimal settings 134 may actually be copied from the default settings 133 and thus not yet optimized, which are then adjusted over time until optimized. Once the settings memory 135 is programmed with the optimal settings 134, subsequent wakeup times of the controller 132 can be significantly reduced.

At next block 404, the controller 132 activates the crystal amplifier 112 and uses the default/adjusted/optimal settings for a single phase. As previously described, during initial startups the optimal settings may not be optimal but instead are copied from the default settings 133 and thereafter adjusted until the optimal settings 134 are finalized. If an update to STARTUP is indicated by the controller 132 as further described herein for the current iteration, the timing circuit 138 is restarted or otherwise reset to begin tracking elapsed time. At next block 406, the controller 132 monitors the FAIL signal indicating whether oscillation has failed, in which the FAIL signal is asserted when the timing circuit 138 reaches the timeout value TMO before LD is asserted. TMO represents a maximum timeout which indicates that the crystal oscillator 154 has failed to startup within a predetermined maximum amount of time. If FAIL is not asserted, operation transitions to block 408 in which the controller 132 monitors LD. LD is asserted by the level detector 130 when the crystal oscillator 154 is oscillating at the target amplitude suitable for establishing a reference frequency for the clock circuit 126 to enable wireless communications. Operation loops between blocks 406 and 408 until either FAIL or LD is asserted.

Assuming that LD is asserted before FAIL, operation advances to block 410 in which the controller 132 asserts RDY to indicate successful startup of the crystal oscillator 132, in which RDY may be asserted after the startup time margin STMGN (small timing margin for stabilization). It is noted that STMGN may be omitted or may simply be zero. Also, RDY may be asserted immediately after LD even if the oscillation signal is stabilizing since the communication system 101 may also insert a system delay (e.g., TSYS) after assertion of RDY. If an update to STARTUP is indicated, then controller 132 reads the new start time value $STARTUP_{NEW}$ from the register 141 (from the timing circuit 138) and updates the STARTUP value stored at the memory location 140. Various methods are contemplated for updating STARTUP with a newly measured startup value $STARTUP_{NEW}$ as further described herein, such as comparing and updating, digital averaging, statistical analysis, one-time adjustment, changes in temperature, etc. It is noted that if the actual startup time is greater than the stored STARTUP value such that the crystal oscillator 154 is not ready in time, one or more communication packets may be dropped during the current communication session. A few dropped packets over time is relatively inconsequential, and the wireless circuit 102 may adjust over time to minimize dropped packets.

At next block 412, a logic variable OPT is queried to determine whether the optimal settings 134 have been determined and stored. Assuming, for the moment, that the optimal settings 134 have been determined and finalized so that OPT is true, operation advances to block 414 in which the processor 108 performs an RX/TX communication session (or other operation using the crystal oscillator 154). Operation then advances to block 415 to schedule the next session. In the first iteration after POR, the processor 108 may announce the device in a wireless network or otherwise according to the applicable wireless protocol. After the processor 108 establishes wireless communications in the wireless network, a subsequent start time tRX is scheduled for the next RX/TX communication session which means that the oscillation signal must be stable having the correct frequency and amplitude no later than the time indicated by tRX.

In block 415, the processor 108 determines a wakeup time delay ahead of the scheduled communication time taking into account the STARTUP value stored at the memory location 140. The processor 108 adds STARTUP to a delay time TCW for waking up the controller 132, and also adds an additional system delay time TSYS to enable the wireless system to prepare for RX/TX communications. In this manner, the processor 108 adds STARTUP, TCW and TSYS as a total system delay, and subtracts the total system delay from the startup time tRX to determine the wakeup delay value WDEL programmed into the WAKEUP circuit 144. It is noted that since the processor 108 may insert a delay after RDY, e.g., TSYS, that the small startup stabilizing margin STMGN added in block 410 may not be necessary or otherwise may be zero.

After the WAKEUP circuit 144 is programmed, the processor 108 (or other sequencing circuit or device) places the wireless circuit 102 into the sleep mode at next block 416. Operation loops between blocks 416 and a next block 418 during sleep mode waiting for WUP to be asserted. When WUP is asserted, operation advances to block 420 in which the wireless circuit 102 is awakened from the sleep mode. As noted above, since the settings memory 135 has already been programmed with the optimal settings 134, the controller 132 awakens in a relatively short amount of time. Operation returns to block 404 in which the controller 132 activates the crystal amplifier 112 and uses the optimal settings 134, and may also restart the timing circuit 138 if an update to STARTUP is indicated. Assuming successful startup of the crystal oscillator 154, RDY is asserted and a new value STARTUP$_{NEW}$ is determined and STARTUP at the memory location 140 is updated as indicated at block 410. Operation loops between blocks 404 and 420 for subsequent wakeup events and scheduled RX/TX communication sessions.

Presumably, since STARTUP is based on actual measurement(s) of the amount of time to establish oscillation by the crystal oscillator 154, very little additional time is wasted waiting for the crystal oscillator 154 to startup ahead of time. Essentially, STARTUP provides a just-in-time startup delay for the particular crystal 152 and IC combination with only minimal margin for error and with optional temperature compensation. In this manner, rather than spending a substantial amount of time in the laboratory determining startup times for multiple crystals with wide variances for determining an appropriate time margin for a worst case startup time, the startup time is actually measured and used to minimize startup time and reduce power consumption. Furthermore, once the optimal settings are determined and finalized, startup incurs a minimum amount of energy.

In the event of a sleepy crystal in which the optimal settings 134 are not sufficient for successful startup of the crystal oscillator 154, the timing circuit 138 reaches TMO and FAIL is asserted before LD indicating oscillation failure as determined at block 406. In this case, operation instead advances to block 422 in which the controller 132 retrieves the robust settings 136 from the memory 110, and deactivates and then reactivates the crystal amplifier 112 and uses the robust settings 136. As previously described, the robust settings 136 further increase the magnitude of the negative resistance of the crystal amplifier 112 and may also reduce the threshold requirements to ensure startup of the crystal oscillator 154 even when the crystal 152 is sleepy. Operation advances to successive inquiry blocks 424 and 426 in which the controller 132 monitors FAIL and LD in a similar manner as previously described. Assuming LD is asserted before FAIL as determined at query block 426, operation returns to block 415 to schedule the next communication time. In one embodiment, if the optimal settings 134 are overwritten by the robust settings 136 in the settings memory 135, then after successful startup, the optimal settings 134 may be re-loaded into the settings memory 135 for subsequent startup events (until a next time when the crystal oscillator 154 may fail to start). Alternatively, the robust settings 136 may not be stored into the settings memory 135 since used on a relatively infrequent basis.

If for any reason FAIL is asserted before LD is asserted as determined at block 424, operation instead advances to block 428 in which the wireless circuit 102 enters an error mode or the like. In this case the crystal oscillator 154 failed to start using the robust settings 136, so that the wireless device 100 may have failed or may otherwise be unable to perform wireless communications or other operations using the crystal oscillator 154. Alternatively or in addition, if the robust settings 136 fail to start a sleepy crystal once or a certain number of times, then the error mode 428 may be used to instruct the controller 132 to adjust or strengthen the robust settings 136 and attempt startup again. In one embodiment, the controller 132 may incrementally or gradually adjust the robust settings 136 and attempt re-start any number of times to achieve successful startup. Alternatively, the multiple sets of robust settings 136 may be stored and used in the alternative, or one or more parameters of the stored robust settings 136 may include multiple values in which more aggressive settings may be used in the event of one or more oscillation failures. If the crystal oscillator 154 fails to start using maximum robust settings, then an error condition is determined.

In addition, the controller 132 may keep track the number of times block 422 is performed (application of robust settings) relative to the number of total startups over time, and in the event the count becomes excessive or is significantly beyond what is expected for sleepy crystals, then the controller 132 may adjust the optimal settings 134 to increase likelihood of successful startup during normal operation. In this case, for example, failure may be caused by sub-optimal settings in the optimal settings 134 rather than because of a sleepy crystal.

Referring back to block 412, in the very first iteration and for multiple sequential iterations thereafter until a minimum startup energy ESTART$_{MIN}$ value is determined, the optimal settings 134 are still being determined and optimized so that OPT is initially false. If so, then operation advances instead to block 430 in which a startup energy ESTART is calculated for the current startup period using the new startup value STARTUP$_{NEW}$. In general, the startup energy is calculated as ESTART=tSTART*ITOTAL (in which an asterisk "*" denotes multiplication), in which ITOTAL is the total current including the core bias current CB added to IOTHER (ITOTAL=CB+IOTHER), and tSTART is the startup time for a particular period. For the single phase embodiment shown in FIG. 3, the core base current is the current CBAS value so that ITOTAL=CBAS+IOTHER, and tSTART=STARTUP$_{NEW}$, so that ESTART$_{NEW}$ (the new startup energy calculation)=STARTUP$_{NEW}$*(CBAS+IOTHER). The new startup energy calculation value ESTART$_{NEW}$ is compared with one or more prior startup energy values and a minimum one of the startup energy values measured so far is determined. When the minimum startup energy value ESTART$_{MIN}$ is determined at block 430, then OPT is set true and the corresponding core bias value CBAS is stored in the optimal settings 134. Thereafter, block 430 is bypassed. Otherwise if the minimum startup energy ESTART$_{MIN}$ is not yet determined at block 430, then CBAS is adjusted for the next iteration. Operation then advances to block 414 previously described for performing the scheduled operation or communication session. It is noted that block 430 may be performed in parallel with block 414. Thus, when OPT is false, operation may advance to both blocks 430 and 414 in parallel.

In this manner, Rather than spending a substantial amount of laboratory time to test each of the different crystal types to determine the values or settings of startup parameters to minimize startup energy, the wireless device 100 adjusts the gain via startup core bias current CBAS, measures the startup energy associated with the adjusted CBAS, compares the startup energy with previous energy calculations and ultimately determines the core bias current CBAS that achieves the minimum startup energy. It is noted that when optimization is being performed concurrently with normal communication operations, a larger margin can be added to STARTUP to reduce the number of missed packets that could arise from not waking up in time. Another option is to have the wireless device 100 startup a sufficient number of times regardless of communication sessions to optimize the startup energy and determine the optimal startup time.

In one embodiment the optimization can be done when the device is 'in-the-field' or the optimization could be implemented as part of a production test, in the case of a module or PCB test or the like. In another embodiment the initial settings can be determined in production test and then re-optimized 'in-the-field' using the saved 'optimal settings' as a starting point. Regardless of when the optimization is performed, the optimization results can be stored in the memory 110.

Figure 5:
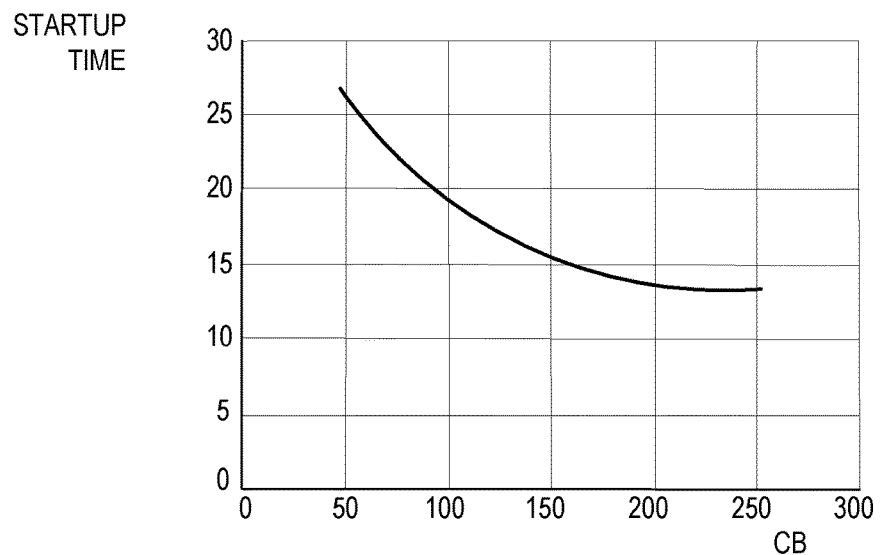
FIG. 5 is a graphic diagram plotting normalized startup time versus normalized core bias current CB, in which specific units are not shown.

FIG. 5 is a graphic diagram plotting normalized startup time versus normalized core bias current CB, in which specific units are not shown. The graphic diagram of FIG. 5 illustrates that startup time may be reduced by increasing CB up to a point. Although more information is needed to determine startup energy, FIG. 5 nonetheless suggests that minimizing startup energy depends upon the relationship between the core bias current CB and IOTHER. For example, if IOTHER is substantially large, then FIG. 5 suggests startup energy may be reduced by reducing startup time at the expense of increasing core bias current. On the other hand, if IOTHER is relatively small, then startup energy may be reduced by reducing the core bias current at the expense of increasing the startup time.

Figure 6:
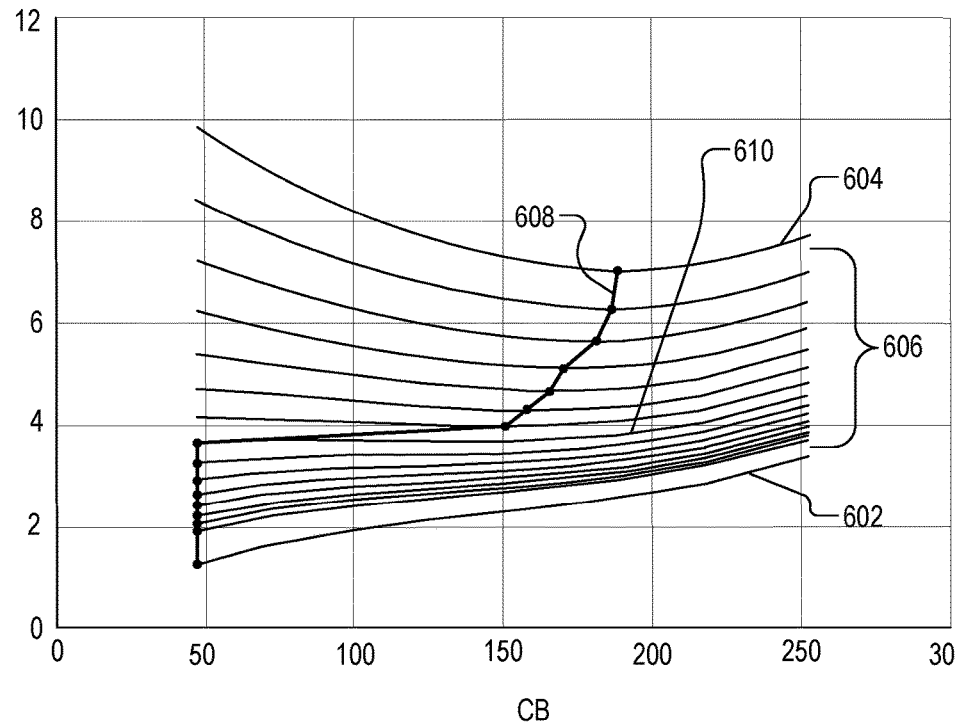
FIG. 6 is a graphic diagram plotting normalized startup energy versus normalized core bias current for several different values of IOTHER, in which specific units are not shown.

FIG. 6 is a graphic diagram plotting normalized startup energy ESTART versus normalized core bias current for several different values of IOTHER, in which specific units are not shown. A first curve 602 is plotted for IOTHER=0, in which case only the core bias current CB contributes to the startup energy. The first curve 602 is only provided for purposes of comparison. For low values of IOTHER, startup energy is minimized by reducing CB to a minimum value. A last curve 604 is plotted for a relatively high value of IOTHER. A series of intermediate curves 606 illustrate incrementally increasing IOTHER from the first curve 602 (for minimum IOTHER) to the last curve 604 (for a maximum IOTHER) for a particular configuration. A dot is placed at the minimum energy point for each of the curves, and a minimum energy curve 608 is plotted by connecting the minimum energy dots. The general trend is that energy is minimized by minimizing CB for the lower values of IOTHER up to an intermediate curve 610. Thereafter, while IOTHER is increased, the minimum energy is achieved at an increased level of the core bias current CB. These trends are shown for optimization purposes and for different oscillator designs and or different crystals their shape might be significantly different. In any event, changing startup parameters, like CB and others, and measuring startup time allows optimization of the startup energy.

Many methods may be used to identify the optimal value of the core bias current CBAS that results in the minimum startup energy. For example, in a simplistic approach CBAS may be incrementally increased from a minimum value to a maximum value while measuring and comparing the startup energy for each iteration, and selecting the value of CBAS that provides the minimum startup energy. In one embodiment, CBA is a digital code value with a full scale of 256 different values (e.g., 0 to 255). It is understood, however, that boundary conditions may apply in which the very lowest values and the very highest values of the core bias current may be unsuitable for startup. In this manner, the core bias current is adjusted within minimum and maximum values. In one embodiment, for example, a subset of code values of 50 to 220 may need to be tested for a total of 171 startups to search the core bias setting providing the minimum energy. In yet another embodiment, a binary search method, such as that shown and described in FIG. 7, may be used rather than an incremental search.

It is further noted that rather than having to perform multiple actual startups, multiple "false" startups may instead be used for startup energy testing. In particular, in one embodiment the controller 132 repeatedly deactivates and reactivates the crystal oscillator 154 multiple sequential times while adjusting CBAS, measuring STARUP$_{NEW}$ and calculating and comparing startup energy ESTART for each iteration. In addition, an intermediate powered-down state may be implemented in which the oscillation system 103 along with any other needed circuitry may remain powered up for startup energy testing.

Figure 7:
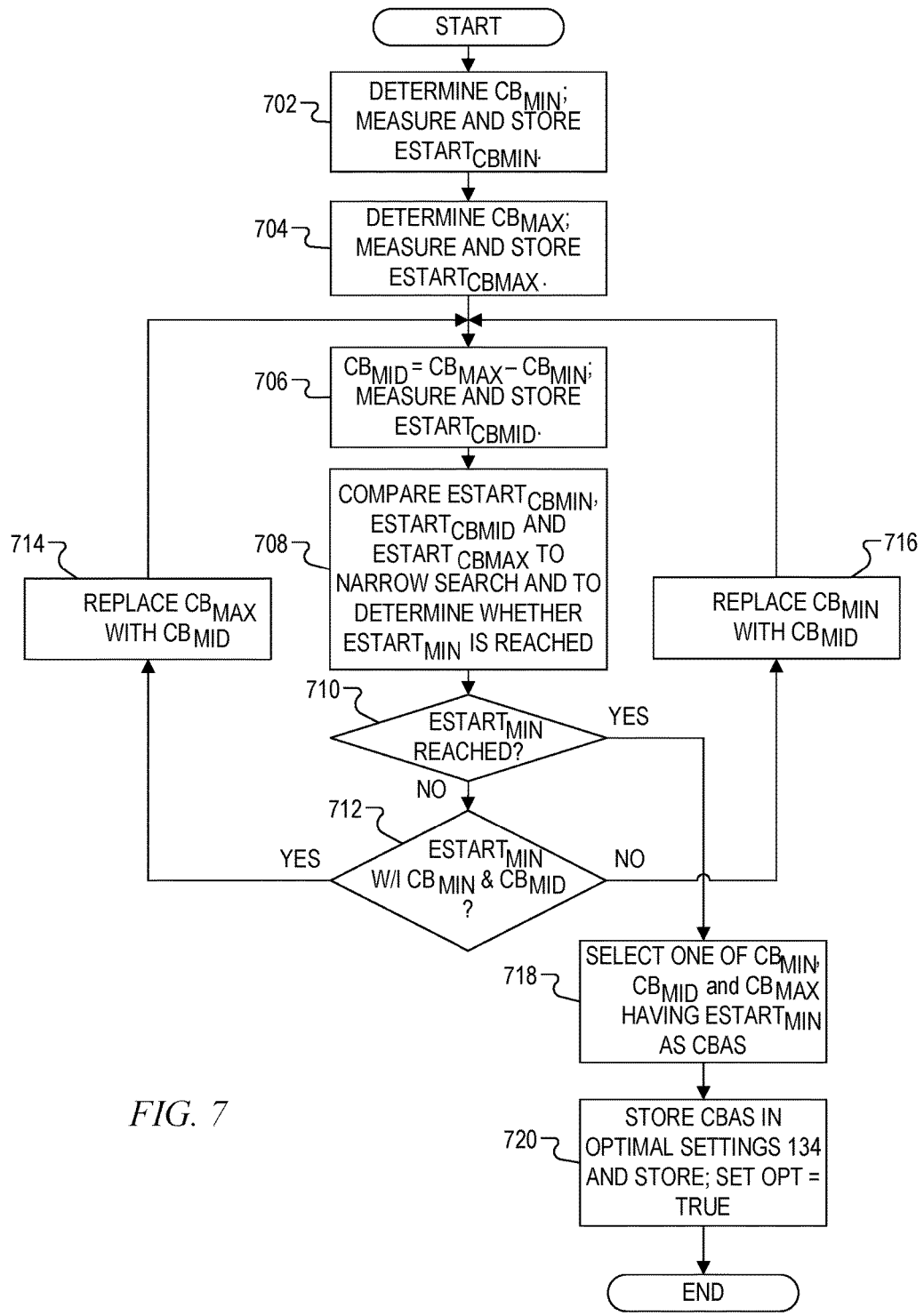
FIG. 7 is a flowchart diagram illustrating a binary search method according to one embodiment for determining minimum startup energy.

FIG. 7 is a flowchart diagram illustrating a binary search method according to one embodiment for determining ESTART$_{MIN}$. As previously noted, the core bias current CB of the crystal amplifier 112 is directly adjusted via CBA to adjust gain. If gain is adjusted in another manner, then CB is separately measured or estimated to calculate energy. At a first block 702, a core bias value CB$_{MIN}$ is determined and a corresponding energy calculation ESTART$_{CBMIN}$ using $CB_{MIN}$ is made and stored. In one embodiment, $CB_{MIN}$ may be a predetermined default value, such as a digital code value of CBA=50 within a digital code range of 0 to 255. In another embodiment, CBA may be incrementally reduced from the default minimum until startup fails in which the lowest core bias value (or the next lowest value) having a successful startup may be selected as the $CB_{MIN}$ value. It is noted that the lowest successful value may be increased by a marginal amount to avoid a marginal setting that may fail with changing conditions.

At next block 704, a core bias value $CB_{MAX}$ is determined and a corresponding energy calculation $ESTART_{CBMAX}$ using $CB_{MAX}$ is made and stored. In one embodiment, $CB_{MAX}$ may be a predetermined default value, such as a digital code value of CBA=250 within a digital code range of 0 to 255. In another embodiment, CBA may be incrementally increased (or decreased) beginning from the default maximum value until startup fails in which the highest core bias value (or the next highest value) having a successful startup may be selected as the $CB_{MAX}$ value. In another embodiment CBA may be incrementally increased (or decreased) beginning from the default maximum to determine when startup time does not decrease with an increase of CBA, since beyond that point increasing CBA does not reduce in startup energy.

At next block 706, a mid-level core bias value $CB_{MID}$ is determined as the difference between $CB_{MAX}$ and $CB_{MIN}$, and a corresponding energy calculation $ESTART_{CBMID}$ using $CB_{MID}$ is made and stored. At next block 708, the startup energy values $ESTART_{CBMIN}$, $ESTART_{CBMID}$, and $ESTART_{CBMAX}$ are compared to narrow the search and to determine whether the minimum startup energy $ESTART_{MIN}$ has been reached. The search is narrowed using the comparison to determine whether the minimum is between $CB_{MIN}$ and $CB_{MID}$, or between $CB_{MID}$ and $CB_{MAX}$. As an example with reference to the curve 604 of FIG. 6, the startup energy at CB values of 50, 150 and 250 may be compared to determine that the minimum lies somewhere between 150 ($CB_{MID}$) and 250 ($CB_{MAX}$). The minimum startup energy $ESTART_{MIN}$ may be determined when the three energy values (or the three corresponding core bias current values) are sufficiently close to each other, such as within a predetermined threshold.

At next block 710 it is queried whether $ESTART_{MIN}$ has been determined. If not, operation advances to block 712 to query whether $ESTART_{MIN}$ is determined to be located between $CB_{MIN}$ and $CB_{MID}$. If so, operation advances to block 714 in which the core current value $CB_{MAX}$ is replaced with the core current value $CB_{MID}$, and then operation loops back to block 706 in which $CB_{MID}$ is replaced by $CB_{MAX}$-$CB_{MIN}$. As an example with reference to curve 610 of FIG. 6, for a first full range search with $CB_{MIN}$=50, $CB_{MID}$=150 and $CB_{MAX}$=250, if it is determined that the minimum energy is for a CB value between 50 and 150, then $CB_{MAX}$ is changed to 150 and $CB_{MID}$ is changed from 150 to 150−50=100. Thus, the next search uses the values $CB_{MIN}$=50, $CB_{MID}$=100 and $CB_{MAX}$=150. In this manner, the search has been reduced to the left side between 50 and 150. In addition, another $ESTART_{CBMID}$ is measured and stored at block 706. At next block 708, the corresponding startup energy values for the MIN, MID and MAX values are compared again within the new, narrowed search range.

Referring back to block 712, if instead it is determined that $ESTART_{MIN}$ is not located between $CB_{MIN}$ and $CB_{MID}$ so that $ESTART_{MIN}$ is located between $CB_{MID}$ and $CB_{MAX}$, operation advances instead to block 716 in which the core current value $CB_{MIN}$ is replaced with the core current value $CB_{MID}$, and then operation loops back to block 706 in which $CB_{MID}$ is replaced by $CB_{MAX}$-$CB_{MIN}$. As an example with reference to curve 604 of FIG. 6, in this case it is determined that the minimum energy occurs for a CB value between 150 and 250, so that $CB_{MIN}$ is changed to 150 and $CB_{MID}$ is changed from 150 to 250−150=200. Thus, in this case the next search uses the values $CB_{MIN}$=150, $CB_{MID}$=200 and $CB_{MAX}$=250. In this manner, the search has been reduced to the right side between 150 and 250. In addition, another $ESTART_{CBMID}$ is measured and stored at block 706. At next block 708, the corresponding startup energy values for the MIN, MID and MAX values are compared again within the new, narrowed search range to determine whether $ESTART_{MIN}$ is determined or otherwise to further narrow the search range.

Operation repeats in this manner in which the search range is effectively reduced by half with each iteration according to a binary search method. Eventually, the startup energy converges on a minimum energy value determined at block 710, in which operation advances to block 718 in which one of the core bias current values $CB_{MIN}$, $CB_{MID}$ and $CB_{MAX}$ associated with the minimum startup energy $ESTART_{MIN}$ is selected as the startup core bias current CBAS. At next block 720, CBAS is stored in the optimal settings 134 and stored, and OPT is set equal to true. Referring back to FIG. 4, the flowchart of FIG. 7 is an implementation representing multiple iterations of block 430 for determining the core bias value CBAS providing the minimum startup energy $ESTART_{MIN}$. Once $ESTART_{MIN}$ is determined, OPT is set true and the search is completed.

It is noted that the binary search described in FIG. 7 may need to be adjusted for energy curves that exhibit multiple local minimums within the core bias current range. For example, the binary search may be performed for each of multiple subranges to determine the true minimum. Alternative search algorithms may be used for different configurations.

Figure 8:
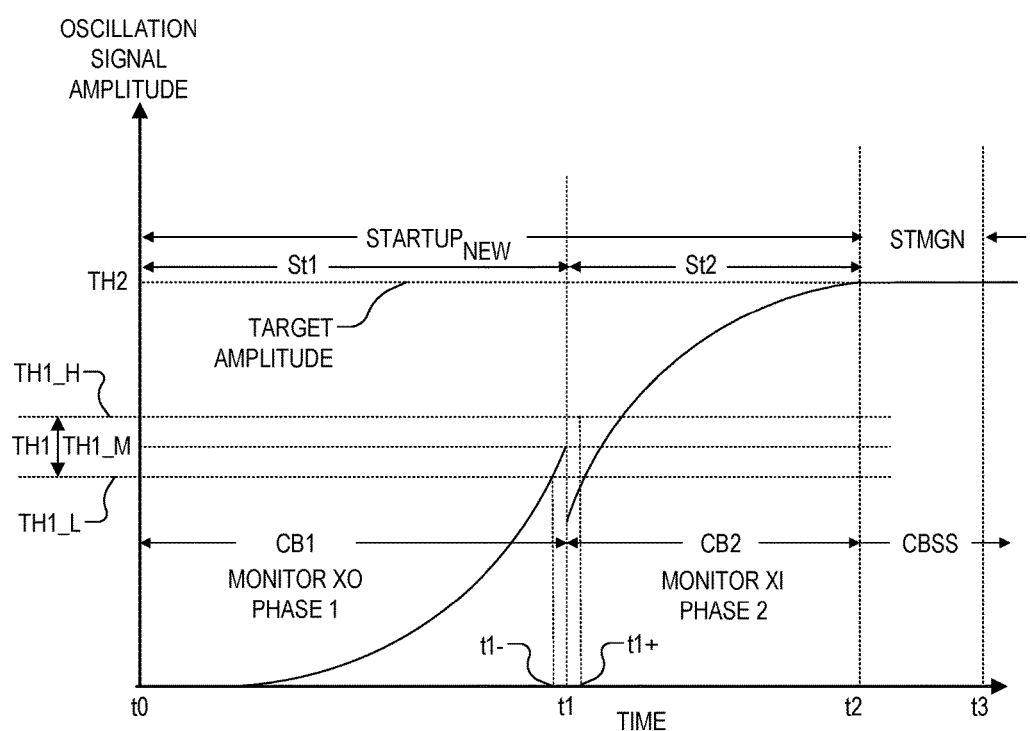
FIG. 8 is an idealized timing diagram plotting the amplitude of the oscillation signal versus time during startup of the crystal oscillator of FIG. 1 for a dual phase configuration.

FIG. 8 is an idealized timing diagram plotting the amplitude of the oscillation signal versus time during startup of the crystal oscillator 154 for a dual phase configuration. For the dual phase, a first core bias current CB1 is used for a first phase 1 until the oscillation signal amplitude reaches a first threshold TH1, then a second core bias current is used for a second phase 1 until the oscillation signal amplitude reaches the final threshold TH2. The units of amplitude and time are not specifically shown since the amplitude curve generally represents many different configurations or implementations. At an initial time t0, the controller 132 activates the crystal oscillator 154 and asserts oscillation parameters at selected settings. For example, the controller 132 adjusts the CBA value to CB1 causing the current source 124 to drive a relatively high level of core bias current. Although not specifically shown in FIG. 8, the controller may also adjust the CTA value(s) to reduce the capacitance of one or both of the tune capacitors C1 and C2, and to elevate the voltage applied to the amplifier core 118. In the illustrated embodiment, the controller 132 asserts SL to initially monitor XO (or the OUT signal asserted on the amplifier output node 122) and the threshold value TH is set within a range of intermediate threshold values TH1. As shown, TH1 may range from a low value TH1_L to a high value TH1_H, where TH1 is shown set at a mid-way value TH1_M near the middle of the TH1 range. For example, the default settings 133 may initially specify TH1_M, which may be adjusted to a final value stored within the optimal settings 134.

Assuming normal operation, the crystal oscillator 154 begins to oscillate and the oscillation signal on XO begins to increase during the first startup phase. When the oscillation amplitude reaches TH1_M at about a time t1, the level detector 130 asserts LD and the controller 132 responsively switches SL to monitor the amplifier input pin XI for the second startup phase 2. The relative amplitude between XI and XO may be different. As shown, for example, the amplitude may decrease when switching from XO to XI. For phase 2, the controller 132 adjusts the CBA value to CB2 to change the core bias current, and also adjusts TH to the final target amplitude level TH2. CB2 may be less than or greater than CB1 (depending upon the particular configuration) but should nonetheless be sufficient to achieve the target threshold level TH2. The amplitude of the oscillation signal continues to increase towards the target level TH2, and when reached at a subsequent time t2, the level detector 130 again asserts LD and the controller 132 again adjusts the CBA value to the steady state level CBSS. It is noted that although TH2 is shown greater than TH1, TH2 (for XI) may actually be less than TH1 (for XO). After switching to CBSS, the oscillation signal stabilizes to its final frequency and amplitude. Although the stabilization period may vary somewhat, the fixed stabilizing time margin period STMGN may be added to ensure stabilization of the oscillation signal before asserting RDY. The duration of phase 1 from t0 to t1 is the phase 1 start time St1, the duration of phase 2 from t1 to t2 is the phase 2 start time St2, and the total time St1+St2 (from t0 to t2) is the new startup time $STARTUP_{NEW}$.

As described further herein, the controller 132 adjusts at least one of CB1, CB2 and TH1 for subsequent startups and measures the corresponding startup energy ESTART. As shown, if TH1 is set instead to the low value TH1_L, and assuming CB1 is not changed, then the amplitude reaches TH1_L sooner such as at a time t1−. If CB2 is not changed, then the upper portion of the curve may be somewhat modified from that shown. Or, if TH1 is set instead to the high value TH1_H, and assuming CB1 is not changed, then the amplitude reaches TH1_H later at a time t1+ and the upper portion of the curve may be somewhat different from that shown. Also, if either or both CB1 and CB2 are set too low such that the crystal amplifier 112 does not have sufficient current, then the amplitude may not reach TH1 or TH2, in which case the timing circuit 138 reaches TMO (timeout) and indicates failure of oscillation. The controller 132 senses the oscillation failure and adjusts the current settings accordingly for a subsequent startup.

The controller 132 applies selected values of CB1, CB2 and TH1 (and possibly along with selected settings of other parameters), measures the time values St1 and St2, and assuming oscillation is successful, calculates startup energy for each of phase 1 and phase 2. In general, startup energy is calculated as ESTART=tSTART*ITOTAL, in which ITOTAL includes IOTHER and the core bias current CB. Thus, the startup energy ESTART1 for phase 1 is ESTART1=St1*(CB1+IOTHER), the startup energy ESTART2 for phase 2 is ESTART2=St1*(CB2+IOTHER), and the total startup energy ESTART=ESTART1+ESTART2. It is also noted that IOTHER may have different values for different startup phases.

Figure 9:
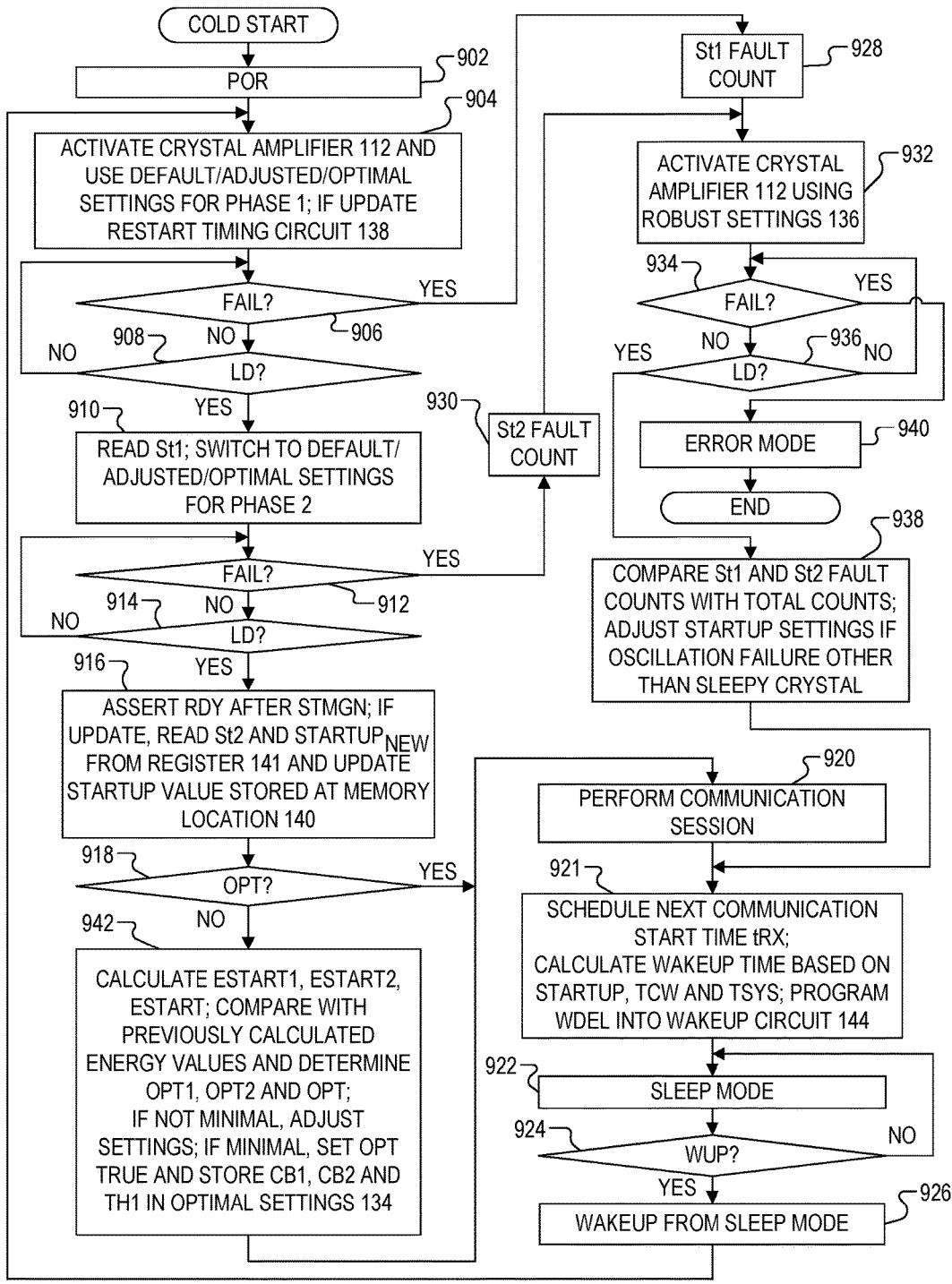
FIG. 9 is a flowchart diagram illustrating operation of the wireless device of FIG. 1 according to a dual phase embodiment.

FIG. 9 is a flowchart diagram illustrating operation of the wireless device 100 according to a dual phase embodiment. Operation begins with a "cold" start at block 902 upon POR of the wireless circuit 102. The processor 108 may perform an initialization or boot-up routine and then transition to a normal operating routine or application. The controller 132 may also be powered up and initialized, which may include retrieving and storing the settings from the optimal settings 134 into the settings memory 135. As previously described, the initial values of the optimal settings 134 may actually be the default values 133 or copied from the default settings 133 and thus not yet optimized, which are then adjusted over time until optimized. Once the settings memory 135 is programmed with settings, subsequent wakeup time of the controller 132 may be significantly reduced.

At next block 904, the controller 132 activates the crystal amplifier 112 and uses the default/adjusted/optimal settings 134 for phase 1. If an update to STARTUP is indicated by the controller 132 as further described herein for the current iteration, the timing circuit 138 is restarted or otherwise reset to begin tracking elapsed time. The settings may include, for example, a core bias current setting for CB1 and a threshold setting for TH1. During subsequent iterations, one or more of the settings are adjusted and updated until the optimal settings 134 that achieve minimal energy are determined. At next block 906, the controller 132 monitors the FAIL signal indicating whether oscillation has failed, in which the FAIL signal is asserted when the timing circuit 138 reaches the timeout value TMO before LD is asserted. If FAIL is not asserted, then at next block 908, the controller 132 monitors LD which is asserted by the level detector 130 when the oscillation signal has reached the threshold setting, such as a selected level of TH1 for phase 1. Operation loops between blocks 406 and 408 until either FAIL or LD is asserted.

Assuming that LD is asserted before FAIL, operation advances to block 910 in which the controller 132 reads St1, the duration of phase 1, stored in the register 203 and then switches to the default/adjusted/optimal settings for phase 2. Again, the first settings for the first POR for phase 2 may be from the default settings 133, and during subsequent iterations, one or more of the settings are updated until the optimal settings 134 are achieved. The settings may include, for example, a core bias current setting for CB2 and a threshold setting for TH2. Operation then advances to blocks 912 and 914 to monitor FAIL and LD once again.

Assuming that LD is asserted before FAIL, operation advances to block 916 in which the controller 132 asserts RDY to indicate successful startup of the crystal oscillator 132, in which RDY may be asserted after the startup time margin STMGN (in which STMGN may be omitted or may simply be zero). Also, RDY may be asserted immediately after LD even if the oscillation signal is stabilizing since the communication system 101 may also insert a system delay (e.g., TSYS) after assertion of RDY. If an update to STARTUP is indicated, then controller 132 reads St2, the duration of phase 2, stored in the register 207, and reads the new start time value $STARTUP_{NEW}$ from the register 141 and updates the STARTUP value stored at the memory location 140. Various methods are contemplated for updating STARTUP with a newly measured startup value as further described herein.

At next block 918, the logic variable OPT is queried to determine whether the optimal settings 134 have been determined and stored. Assuming, for the moment, that the optimal settings 134 have been determined and finalized so that OPT is true, operation advances to block 920 in which the processor 108 performs an RX/TX communication session (or other operation using the crystal oscillator 154), and then advanced to block 921 to schedule the next session. In the first iteration after POR, the processor 108 may announce the device in a wireless network or otherwise according to the applicable wireless protocol. After the processor 108 establishes wireless communications in the wireless network, a subsequent start time tRX is scheduled for the next RX/TX communication session which means that the oscillation signal must be stable having the correct frequency and amplitude no later than the time indicated by tRX.

At block 921, the processor 108 then determines a wakeup time delay ahead of the scheduled communication time taking into account the STARTUP value stored at the memory location 140. The processor 108 adds STARTUP, TCW and TSYS as a total system delay, and subtracts the total system delay from the startup time tRX to determine the wakeup delay value WDEL programmed into the WAKEUP circuit 144. It is noted that since the processor 108 may insert a delay after RDY, e.g., TSYS, that the small startup stabilizing margin STMGN added in block 410 may not be necessary or otherwise may be zero.

After the WAKEUP circuit 144 is programmed, the processor 108 (or other power device) places the wireless circuit 102 into the sleep mode at next block 922. Operation loops between blocks 922 and a next block 924 during sleep mode waiting for WUP to be asserted. When WUP is asserted, operation advances to block 926 in which the wireless circuit 102 is awakened from the sleep mode. As noted above, since the settings memory 135 has already been programmed with the optimal settings 134, the controller 132 awakens in a relatively short amount of time. Operation returns to block 904 in which the controller 132 activates the crystal amplifier 112 once again for phase 1, and may restart the timing circuit 138. Operation loops between blocks 904 and 926 for subsequent wakeup events and scheduled RX/TX communication sessions.

In the event that FAIL is asserted before LD at block 906, operation instead advances to block 928 in which a fault count is tracked for St1. In this case, the amplitude of the oscillation signal failed to reach the first threshold TH1. Also, in the event that FAIL is asserted before LD at block 912, operation instead advances to block 930 in which a fault count is tracked for St2. In this case, the amplitude of the oscillation signal reached the first threshold TH1 but failed to reach the final threshold TH2. After either block 928 or 930, operation advances to block 932 in which the controller 132 retrieves the robust settings 136 from the memory 110 and deactivates and then reactivates the crystal amplifier 112 and uses the robust settings 136. As previously described, the robust settings 136 further increase the magnitude of the negative resistance of the crystal amplifier 112 and may reduce the threshold requirements to ensure startup of the crystal oscillator 154 even when the crystal 152 is sleepy. Operation then advances to inquiry blocks 934 and 936 in which the controller 132 monitors LD and FAIL. Assuming LD is asserted before FAIL as determined at query block 936, operation advances to block 938.

The robust settings 136 are provided to generally ensure startup even for a sleepy crystal. In one embodiment, if the optimal settings 134 are overwritten by the robust settings 136 in the settings memory 135, then after successful startup, the optimal settings 134 may be re-loaded into the settings memory 135 for subsequent startup events (until a next time when the crystal oscillator 154 may fail to start). Alternatively, the robust settings 136 are not stored into the settings memory 135 since used at a relatively infrequent basis.

It is noted, however, that since the controller 132 adjusts startup parameters during the process of minimizing startup energy, oscillation failure may not be caused by a sleepy crystal. At block 938, the comparator 132 examines the St1 and St2 fault counts to distinguish between oscillation failure caused by startup settings versus a sleepy crystal. If either or both of the St1 and St2 the fault counts become excessive or frequent over that normally expected for a sleepy crystal, then the controller 132 may adjust any one or more of the settings for CB1, CB2, and TH1 for the next iteration. As an example, the controller 132 may attempt to determine a minimum core bias current setting for CB1 or CB2, below which oscillation fails. In such situation, the controller 132 incrementally increase CB1 or CB2 until oscillation is achieved. If it is determined that failure was caused by a sleepy crystal, or after adjustment of the settings, operation advances to block 921 to schedule the next communication session.

If for any reason FAIL is asserted before LD as determined at block 934 when using the robust settings 136, then operation advances to block 940 in which the wireless circuit 102 enters an error mode or the like. In this case the crystal oscillator 154 failed to start using the robust settings 136, so that the wireless device 100 may have failed or may otherwise be unable to perform wireless communications. Alternatively or in addition, if the robust settings 136 fail to start a sleepy crystal once or a certain number of times, then the error mode 940 may be used to instruct the controller 132 to adjust or strengthen the robust settings 136 and attempt startup again. In one embodiment, the controller 132 may incrementally or gradually adjust the robust settings 136 and attempt re-start any number of times to achieve successful startup. Alternatively, the multiple sets of robust settings 136 may be stored and used in the alternative, or one or more parameters of the stored robust settings 136 may include multiple values in which more aggressive settings may be used in the event of one or more oscillation failures. If the crystal oscillator 154 fails to start using maximum robust settings, then an error condition is determined.

Referring back to block 918, in the very first iteration and for multiple sequential iterations thereafter, the settings are still being adjusted and optimized so that OPT is initially false. If so, operation advances instead to block 942 in which the energy values ESTART1, ESTART2, and ESTART are measured for phase 1, phase 2, and the total startup energy, respectively, and each is compared with corresponding energy values previously determined. When ESTART1 is minimized for phase 1, OPT1 becomes true, and when ESTART2 is minimized for phase 2, OPT2 becomes true. In some embodiments, once OPT1 and OPT2 are true, then optimization is complete, the optimal settings 134 are finalized, and OPT is also set true. In other embodiments, OPT is not set true until the total startup energy ESTART is also separately minimized, and then OPT is set true. During the very first iteration and for multiple sequential iterations thereafter, the startup energy is not yet minimized so that the controller 132 adjusts one or more settings at block 942 for the next iteration. Operation advances to block 920 to perform the communication session. Once OPT is set true, the final optimal settings 134 are determined and stored at block 942, and thereafter block 942 is bypassed in subsequent iterations.

Eventually, the startup energy is minimized and OPT becomes true. The optimal settings 134 are thus determined and stored and used for subsequent startups with minimized startup energy. While energy is being minimized, the startup time may vary somewhat in which STARTUP may include a larger margin to ensure successful operation at the scheduled time. In this manner, rather than spending a substantial amount of time in the laboratory determining optimal settings to achieve minimized energy for multiple crystals with wide variances, the startup energy is actually measured and ultimately minimize to reduce power consumption.

Various methods may be used to determine a minimum startup energy during multiple startups. In one embodiment, TH1 is held at a fixed value, CB1 is adjusted for minimizing phase 1 startup energy ESTART1, CB2 is adjusted for minimizing phase 2 startup energy ESTART2, and the total startup energy is not separately considered. In this first case, ESTART1 and ESTART2 are separately minimized. In another embodiment in which ESTART1 and ESTART2 are separately minimized, CB1 and TH1 are adjusted for minimizing ESTART1, and CB2 is adjusted for minimizing ESTART2. In another embodiment, after CB1 and CB2 are searched for determining minimum values for ESTART1 and ESTART2, TH1 is incrementally adjusted while holding CB1 and CB2 are held at their determined values to determine whether the total startup energy may be further minimized. In this latter case, the initial value for TH1 may be a minimum value in an allowable range, such as TH1_L, since this reduces the amount of time that the higher current level CB1 is driven. Then TH1 is incrementally increased within the TH1 range while CB1 and CB2 are held constant. In yet another embodiment, CB1, CB2 and TH1 are each adjusted together for minimizing the total startup energy ESTART. In each case, adjustments may be made according to any one of various search methods or criterion for determining the minimum energy values, such as serial search using incremental adjustments, binary search methods, iterative search methods, etc.

When minimizing energy for phase 1 and/or phase 2, the core bias current CB1 and/or CB2 may be optimized separately or together using similar methods previously described for optimizing the single phase core bias current CBAS. As previously described, CBA is a digital code value, such as having binary values 0 to 255. In the simplistic approach, CB1 and CB2 may each be incrementally increased or decreased between minimum and maximum values while measuring energy for each iteration. Although this may need a significant number of startups to converge on the minimum energy values, false startups may be used for startup energy testing as previously described. In addition, a binary search method may be used for optimizing CB1 and CB2, such as that shown and described in FIG. 7. Using the binary search method of FIG. 7, the startup energy for phases 1 and 2 may be minimized for determining optimal values for CB1 and CB2, respectively.

Figure 10:
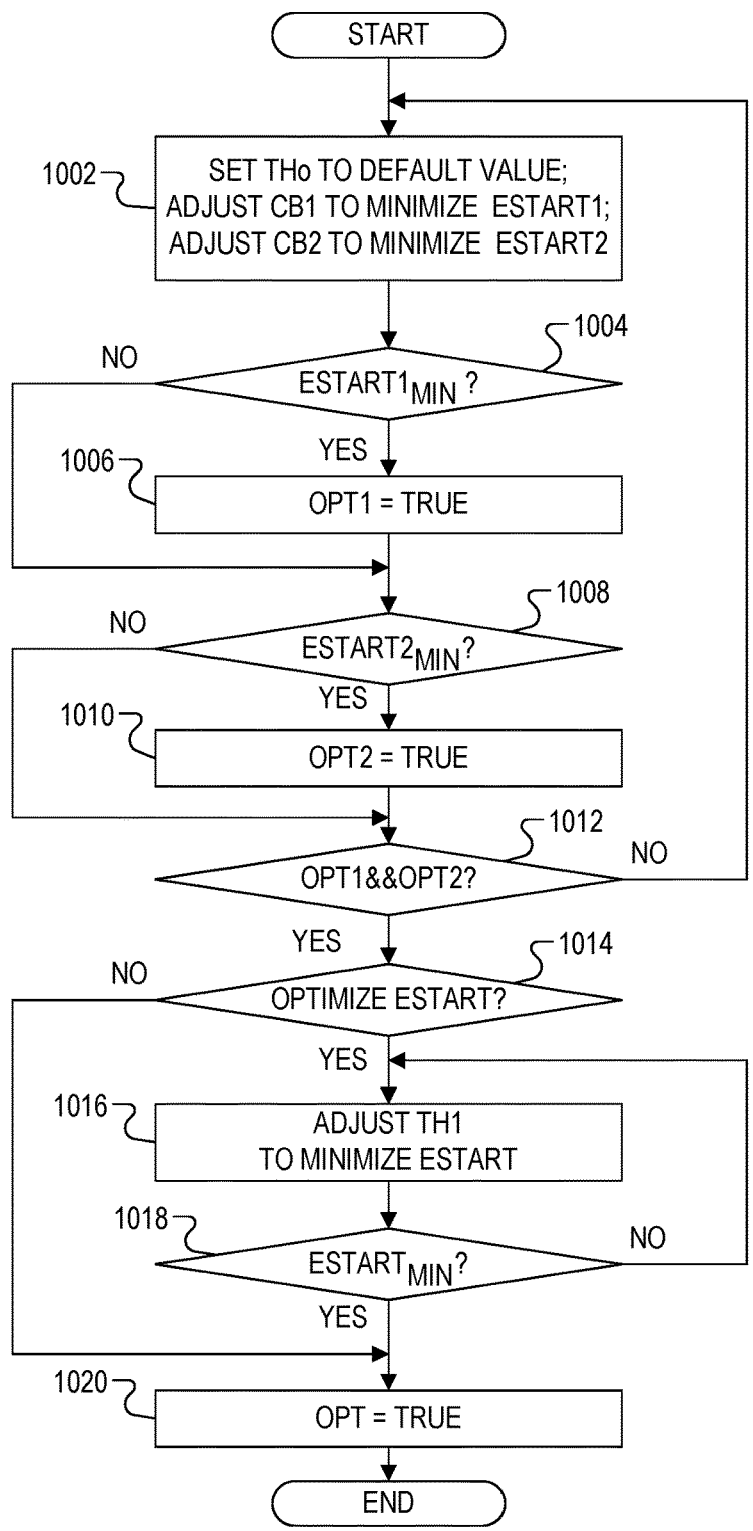
FIG. 10 is a flowchart diagram illustrating operation of the wireless device of FIG. 1 during the process of FIG. 9 during successive startups for minimizing startup energy for the two startup phases of the two phase configuration according to one embodiment.

FIG. 10 is a flowchart diagram illustrating operation of the wireless device 100 during block 942 during successive startups for minimizing startup energy for the two startup phases of the two phase configuration according to one embodiment. In this embodiment, CB1 and CB2 are adjusted together to separately minimize the phase 1 startup energy ESTART1 and the phase 2 startup energy ESTART2 using a default setting of the intermediate threshold TH1. Once both phases are minimized, the total startup energy ESTART may be separately minimized by further adjusting TH1.

At a first block 1002, TH1 is set to a default value, e.g., a selected one of TH1_L, TH1_M or TH1_H shown in FIG. 8, while CB1 is adjusted in successive startups to minimize ESTART1 and CB2 is adjusted in successive startups to minimize ESTART2. It is noted that CB1 may be adjusted first while holding CB2 at a constant default value until ESTART1 is minimized, and then CB2 is adjusted while holding CB1 constant at the determined optimal setting until ESTART2 is minimized, it may be more efficient to simply adjust both in parallel while separately calculating the phase 1 and phase 2 energies. The method of adjusting CB1 and CB2 may be incremental or according to any suitable binary search method, such as the binary search method shown and described in FIG. 7.

At next block 1004, it is queried whether ESTART1 is minimized, meaning a minimum phase 1 energy ESTART1$_{MIN}$ has been determined. If so, operation proceeds to block 1006 in which OPT1 is set true. If not, or after OPT1 is set true, operation proceeds to block 1008 in which it is queried whether ESTART2 is minimized, meaning a minimum phase 2 energy ESTART2$_{MIN}$ has been determined. If so, operation proceeds to block 1010 in which OPT2 is set true. If not, or after OPT2 is set true, operation proceeds to block 1012 to query whether OPT1 and OPT2 have both been set true. If not, operation loops back to block 1002 in which one or both CB1 and CB2 are further adjusted. Operation loops between blocks 1002 and 1012 until ESTART1$_{MIN}$ and ESTART2$_{MIN}$ have both been determined.

When ESTART1$_{MIN}$ and ESTART2$_{MIN}$ have both been determined at block 1012, operation advances to block 1014 in which it is queried whether it is further desired to optimize the total startup energy ESTART. In one embodiment, once ESTART1$_{MIN}$ and ESTART2$_{MIN}$ have both been determined, it may further be desired to adjust the intermediate threshold TH1 to determine whether further minimization is possible. If so, operation proceeds to block 1016 in which TH1 is adjusted from its default value and corresponding total energy ESTART is measured. It is noted that the adjustments to the threshold value TH may be significantly less numerous than those for CBA, and minimum and maximum boundary values may apply. For example, TH may have as little as 2 settings, or TH may have more settings such as on the order of 10 or 20 settings or so, but the number of settings for TH typically will be significantly less than 256 settings. In this manner, TH1 may be incrementally adjusted for each successive startup and energy calculation. In one embodiment, TH1 is incrementally adjusted from its low value of TH1_L to its high value of TH1_H for each total energy calculation, or vice-versa from TH1_H to TH1_L. Alternatively, TH1 may be adjusted up and/or down from a mid value of TH1_M.

After each TH1 adjustment, operation advances to block 1018 to calculate the total energy for the current iteration and compare with previous values or the previously determined minimum total energy so far. If ESTART$_{MIN}$ is not determined, operation loops back to block 1016 for the next adjustment of TH1. Once ESTART$_{MIN}$ is determined at block 1018, operation advances to block 1020 in which OPT is set true, and operation is completed. Referring back to block 1014, after the startup energy has been minimized for both phases, if it is not further desired to adjust TH1, then operation instead advances directly to block 1020 in which OPT is set true, and operation is completed.

FIGS. 8-10 illustrate a dual phase configuration for two startup phases, but the concepts are easily extended to 3 or more startup phases. Initial or default core bias current levels and corresponding level detector thresholds are determined or otherwise provided for a first startup and corresponding startup phase times are measured and corresponding phase energies are calculated. In one embodiment, the level detector thresholds are maintained while the core bias current levels are adjusted for subsequent startups. The startup phase times are measured and corresponding phase energies are calculated for each startup, and each newly calculated startup energy phase value is compared with at least one previously calculated startup energy phase value of a corresponding phase until optimal phase core bias current levels are determined that achieve a minimum phase energy for each phase.

The method shown in FIG. 10, for example, may be extended to adjusting core bias current values CB1, CB2, . . . , CBN for N startup phases for determining corresponding minimum phase energy values $ESTART1_{MIN}$-$ESTARTN_{MIN}$ for N phases. Corresponding logic variables OPT1-OPTN may be set in which the minimum startup energy $ESTART_{MIN}$ may be determined when OPT1&&OPT2&&OPT3 . . . &&OPTN is true. The minimum startup energy may be further minimized by adjusting each of the intermediate level detector thresholds for subsequent startups using the optimized core bias current values for each phase as further illustrated in FIG. 10.

The optimization algorithm may further be generalized by adjusting both the level detector thresholds and the core bias current levels for determining the minimum startup energy. For example, for cases in which multiple parameters are optimized (e.g., core bias, LD threshold, etc.), the optimization may become an iterative process. An iterative process may be desired since the different variables may not be independent from each other. A possible implementation is to optimize ESTART1 and ESTART2 for a given LD threshold TH, and once done, adjust that threshold in one direction and re-optimize to verify if the new optimization point is at a lower energy than the $1^{st}$ optimization point. If the process is improved it may be repeated with another change in the same direction; otherwise, if not improved the process may be repeated by going in the opposite direction beginning with the original threshold until an optimum point is reached.

The optimization algorithm may start from a previous known set of parameters either fixed in hardware or loaded from non-volatile memory or via a register interface or the like, in which case the optimization can start from a previous state or from a default state. The optimization can be done for a given IC and crystal combination for a given temperature and used for all cases, or it can be re-done when temperature changes more than a certain percentage. When re-done, the re-optimization can start over, or the previously determined optimal settings may be used as a starting point. The optimal settings 134 may be then be stored or updated in the non-volatile portion of the memory 110. It is noted that bounding conditions for the algorithm may also be provided via the above methods. These bounding conditions may be tailored for a specific application or for a specific crystal or both.

While the optimal settings 134 are being adjusted from default values to the final optimized values, the startup time may vary significantly as shown in FIG. 5. The STARTUP value stored at the memory location 140 may be set to an initial or default value and held at that value until OPT is set true. The initial default STARTUP value may be a sufficiently large fixed or programmable value, but may generally be held constant until OPT becomes true. Once the optimal settings 134 are determined and stored and OPT is set true, the actual startup times may be periodically or repeatedly measured to determine a sufficiently accurate STARTUP value used for determining an optimal wakeup time. Once the optimal settings 134 are finalized, determining an accurate startup time enables minimum startup energy expenditure by waking up the crystal oscillator just in time to perform a scheduled operation. The system is awakened just in time to perform the scheduled operation so that startup time is minimized, and the settings are optimized to minimize the startup energy of the crystal amplifier 154.

Furthermore, the startup time may be adjusted based on ongoing startup time measurements or in response to other triggers, such as temperature. The following FIGS. 11-16 illustrate various methods for measuring and optimizing STARTUP after POR and after energy optimization has been performed and OPT has been set true.

Figure 11:
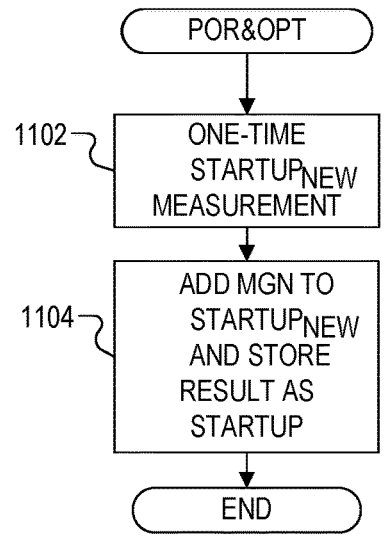
FIGS. 11-16 are flowchart diagrams illustration operation of the controller performing the startup adjust operation of FIG. 2 according to various embodiments, including adding a time margin to the startup time, adjusting the startup time in response to temperature change, adjusting up or down based on remeasured startup times, averaging the startup time with or without adjustment based on temperature, and adjusting the startup time based on statistical analysis.

FIG. 11 is a flowchart diagram illustrating operation of the controller 132 performing the startup adjust operation 204 according to one embodiment. In this relatively simple embodiment, upon POR after OPT has been set true (POR&OPT), the timing circuit 138 is used for a one-time measurement of $STARTUP_{NEW}$ as shown at block 1102. Then the controller 132 adds a margin (MGN) value to $STARTUP_{NEW}$ (or adjusts by a time margin) and stores the result as STARTUP at the memory location 140 as shown at block 1104, and operation is completed. In one embodiment, STARTUP is not subsequently updated and is used for subsequent startups thereafter. Thus, the margin value MGN added at block 1104 should be sufficiently large to account for startup time variations over time, including changes in temperature over the entire operating temperature range. In one embodiment, for example, MGN may be at least 10% of the measured $STARTUP_{NEW}$, but could be as much as 25% or 50% of $STARTUP_{NEW}$ depending upon the particular implementation, expected temperature range, and expected impact of temperature.

Figure 12:
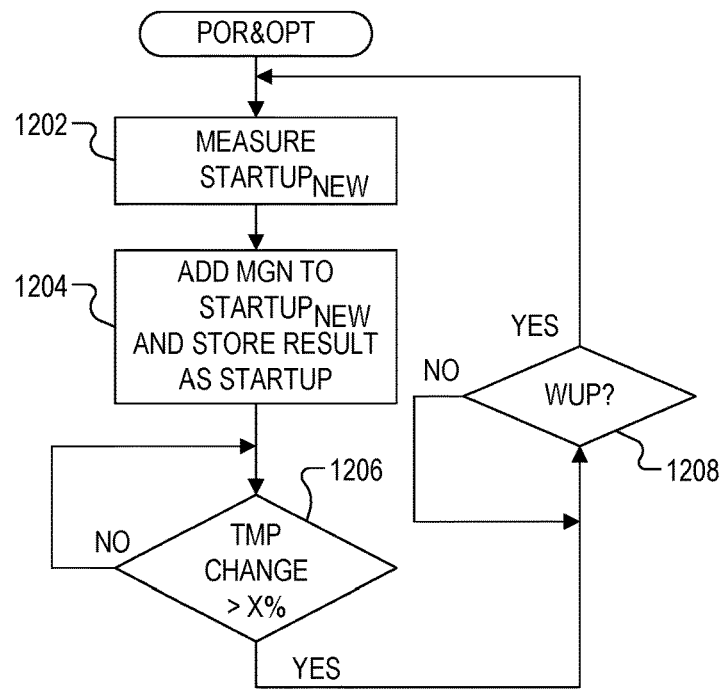

FIG. 12 is a flowchart diagram illustrating operation of the controller 132 performing the startup adjust operation 204 according to another embodiment. Upon each POR after OPT is set true, the timing circuit 138 is used to measure $STARTUP_{NEW}$ upon startup as shown at block 1202. Then the controller 132 may add a margin (MGN) value to $STARTUP_{NEW}$ and store the result as STARTUP at the memory location 140 as shown at block 1204. Operation then advances to block 1206 to query the change in temperature as indicated by a change of the TMP value. If TMP changes more than a predetermined percentage, shown as TMP change >% X in which "X" is set to a predetermined percentage value, then operation advances to block 1208 to wait for the next wakeup indicated by WUP. When WUP is next asserted upon the next wakeup, operation returns to block 102 to repeat the process in which $STARTUP_{NEW}$ is measured again to update STARTUP. The updated STARTUP value is then used for the next startup and thereafter until temperature changes again by the predetermined percentage X %. STARTUP is not updated as long as TMP does not change by the indicated amount at block 1206.

As compared to the embodiment of FIG. 11, the MGN may be a significantly smaller value or even zero since it does not have to account for significant temperature change. Instead, temperature change is compensated since STARTUP is updated when the temperature change is greater than the predetermined amount. The value X may be a fixed value or may be a programmable value. As an example, X may represent a significant temperature change such as, for a non-limiting example, 20%. In an alternative embodiment, rather than a percentage temperature change, the change may be represented as a particular temperature offset value, such as a change by X degrees Celsius (e.g., X° C.). As a non-limiting example, X could be 20° C. or the like.

The method of FIG. 12 may be used to determine STARTUP while the optimal settings 134 are being updated before OPT is true. In that case, MGN is initially set to a relatively large value. Once the optimal settings 134 are finalized and stored and OPT is TRUE, then STARTUP may be optimized by reducing the margin value MGN.

Figure 13:
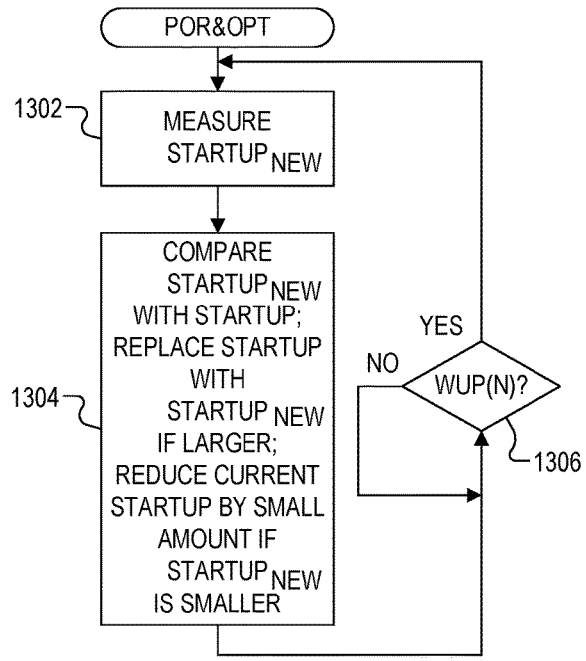

FIG. 13 is a flowchart diagram illustrating operation of the controller 132 performing the startup adjust operation 204 according to yet another embodiment. Upon POR after OPT is true, the timing circuit 138 is used to measure $STARTUP_{NEW}$ upon startup as shown at block 1302. At next block 1304, the controller 132 compares the newly measured $STARTUP_{NEW}$ with the stored startup value STARTUP, if any. The STARTUP value is replaced by the newly measured $STARTUP_{NEW}$ if $STARTUP_{NEW}$ is larger than the currently stored STARTUP value or if STARTUP is null or undefined. Otherwise, STARTUP is reduced by a small amount (e.g., 2% as a non-limiting example) if $STARTUP_{NEW}$ is smaller than the current STARTUP value. If the current and newly measured STARTUP values are equal or sufficiently close, then there is no change. In this manner, if the startup time has increased or is otherwise increasing over time, then STARTUP is increased accordingly to the largest startup time, but if the startup time is decreasing over time, then STARTUP is gradually decreased. In this manner, STARTUP is adjusted on a periodic basis to follow the actual startup time.

Operation then advances to block 1306 to wait for the Nth wakeup indicated by WUP(N). In this case, WUP(N) is intended to mean that operation does not proceed until after N wakeup times. E.g., if N is 1, then WUP(N) is true upon each wakeup, or if N is 5, then WUP(N) is true only after every $5^{th}$ wakeup. When WUP(N) is true, operation returns to block 1302 to repeat the process in which $STARTUP_{NEW}$ is measured again upon the next startup and used to update STARTUP. Operation loops in this manner to update STARTUP over time. It is noted that although a time margin may be added to STARTUP, such time margin may be relatively small or even zero since STARTUP is updated on a periodic basis, such as every wakeup or every Nth wakeup in which N is selected to accurately track startup over time. Although temperature change may also be included as a trigger to adjust STARTUP, it is adjusted on a regular basis and thus inherently incorporates adjustments in response to changes in temperature.

The method of FIG. 13 may also be used to determine STARTUP while the optimal settings 134 are being updated before OPT is true. While OPT is false, STARTUP is likely to increase to a higher value, and then may decrease to an optimal value after OPT is set true. An advantage of the method of FIG. 13 is that the startup time is adapted while the settings are being adjusted. In addition, once the optimal settings 134 are finalized, STARTUP is dynamically adjusted over time to achieve optimal startup time thereafter.

Figure 14:
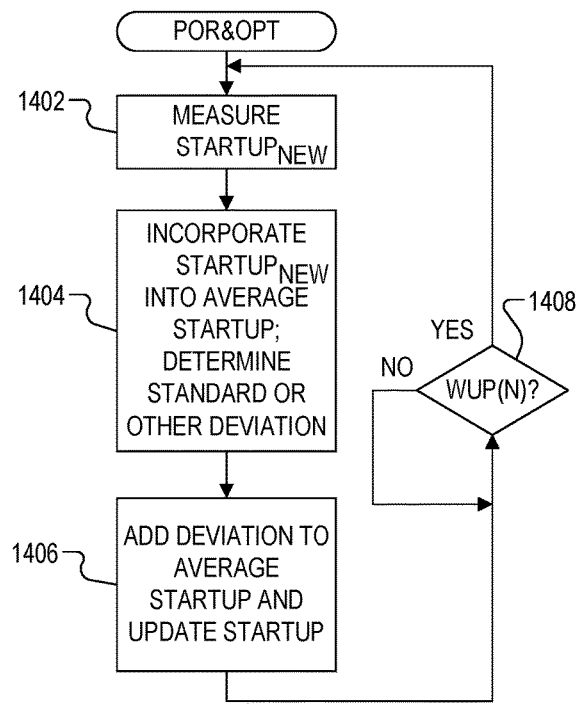

FIG. 14 is a flowchart diagram illustrating operation of the controller 132 performing the startup adjust operation 204 according to another embodiment in which the startup time is averaged over time. Upon POR after OPT is true, the timing circuit 138 is used to measure a new startup time $STARTUP_{NEW}$ as shown at block 1402. At next block 1404, the controller 132 incorporates the new $STARTUP_{NEW}$ into STARTUP, which is an average of previously measured startup times. Such averaging may be according to any one or more methods. In one embodiment, the average value is the average of all measured startup values since POR. This configuration may include a running count of the total number of startup events. In another embodiment, STARTUP is running or moving average value of a fixed window of startup events, such as the last 10 or 20 startup measurements. Also, a standard deviation or other statistical deviation is determined at block 1404. At next block 1306, the controller 132 adds the standard or other statistical deviation to the averaged STARTUP value and the result is stored as STARTUP. Operation then advances to block 1408 to wait for the Nth wakeup indicated by WUP(N) in a similar manner as described for FIG. 13. Operation loops in this manner to update STARTUP over time.

The method of FIG. 14 may also be used to determine STARTUP while the optimal settings 134 are being updated. While OPT is false, the adjustment to STARTUP at block 1406 may err towards larger values, and when OPT becomes true, the adjustments may be more tightly controlled. An advantage of the method of FIG. 14 is that the average startup time is adapted while the settings are being adjusted. In addition, once the optimal settings 134 are finalized, the average STARTUP value is dynamically adjusted over time to achieve optimal startup time thereafter.

Figure 15:
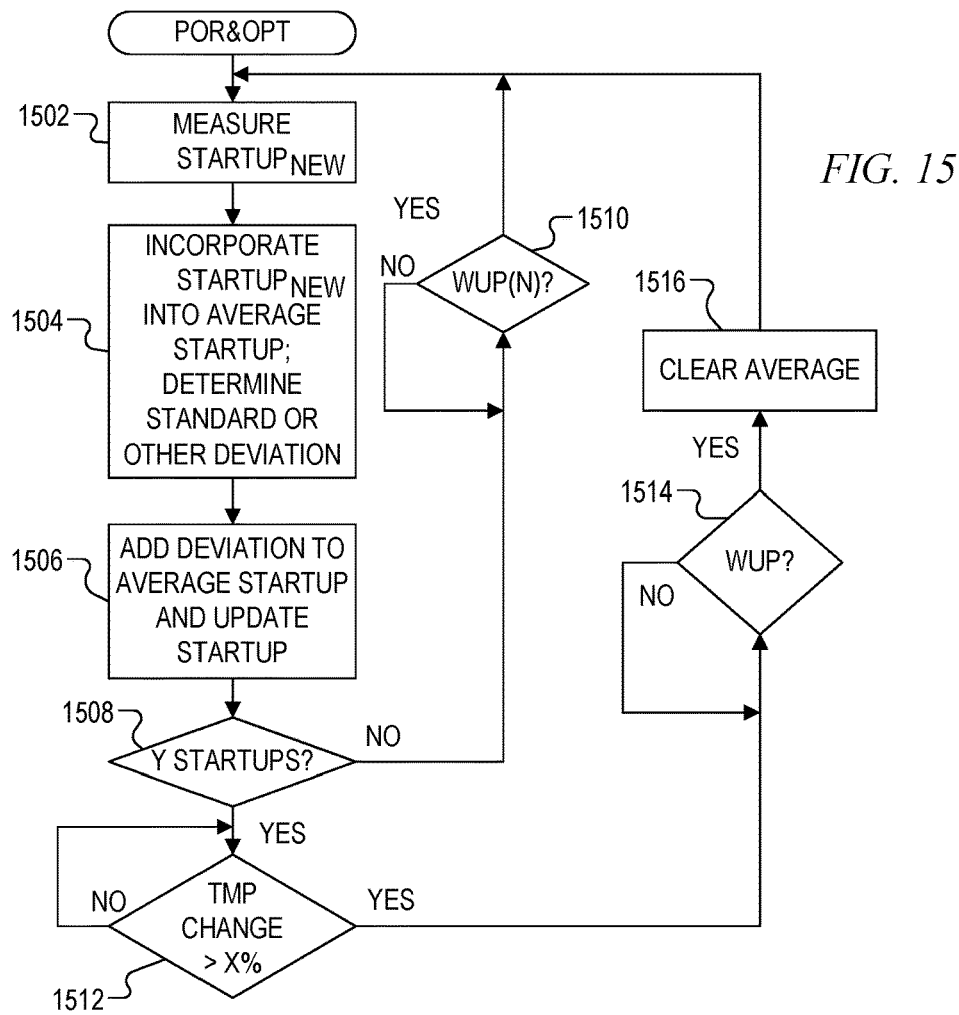

FIG. 15 is a flowchart diagram illustrating operation of the controller 132 performing the startup adjust operation 204 according to another embodiment in which the startup time is averaged only up to a predetermined number of startup events. Upon POR while OPT is true, the timing circuit 138 is used to measure a new startup time $STARTUP_{NEW}$ as shown at block 1502, and then at block 1504, the controller 132 incorporates the $STARTUP_{NEW}$ into the current averaged value of STARTUP and determines a standard deviation or other statistical deviation in similar manner previously described, and then updates STARTUP at next block 1506. In this case, operation proceeds to block 1508 to query whether a number "Y" $STARTUP_{NEW}$ values have been averaged. The number Y is selected to incorporate a sufficient number of measured startup times to obtain a good average value, such as 25, 50, 100, etc., averaged values. If Y has not been reached, operation loops to block 1510 to wait for the Nth wakeup indicated by WUP(N) as previously described. Again, N may be any suitable number including 1. After N startups, operation returns to block 1502 to measure and incorporate the $STARTUP_{NEW}$ into the averaged STARTUP value, and operation continues to loop between blocks 1502 and 1510 until Y startup times have been averaged.

Once Y $STARTUP_{NEW}$ have been averaged as determined at block 1408, operation proceeds instead to block 1512 to inquire whether the temperature as indicated by TMP has changed by more than a predetermined percentage (% X, or by a set temperature value, e.g., X° C.) in a similar manner as previously described. In other words, the average value is used until the temperature changes by a significant amount. When the temperature has changed as determined at block 1512, operation proceeds to block 1514 to wait for the next wakeup as indicated by WUP. Upon the next wakeup, operation advances to block 1516 in which the current average value is cleared, and then operation returns to block 1502 to measure a new $STARTUP_{NEW}$ and start a new average of the next Y $STARTUP_{NEW}$ values. Operation repeats in this manner to obtain an newly averaged value of Y startup times for the changed temperature.

The method of FIG. 15 may also be used to determine STARTUP while the optimal settings 134 are being updated in a similar manner as the method of FIG. 14. An advantage of the method of FIG. 15 is that the average startup time may be adapted while the settings are being adjusted and with changes in temperature. In addition, once the optimal settings 134 are finalized, the average STARTUP value is dynamically adjusted over time to achieve optimal startup time thereafter, including changes in temperature.

Figure 16:
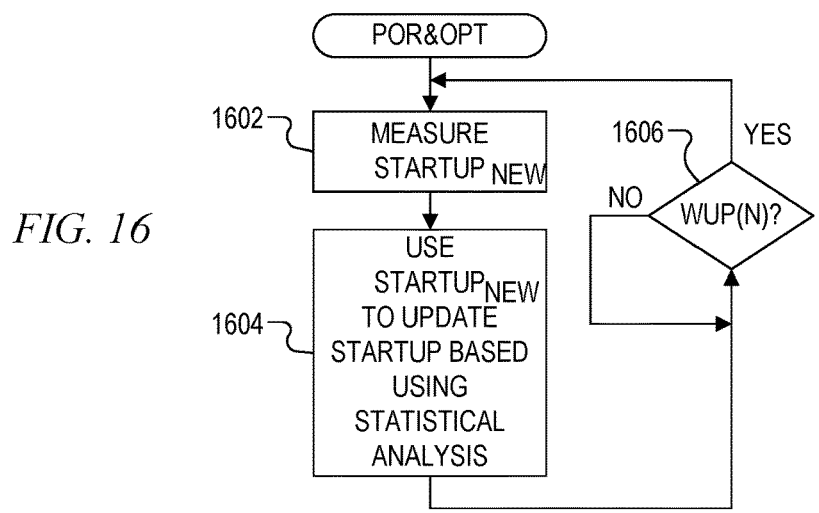

FIG. 16 is a flowchart diagram illustrating operation of the controller 132 performing the startup adjust operation 204 according to a more generalized statistical analysis embodiment. Upon POR after OPT is true, the timing circuit 138 is used to measure a new startup value STARTUP$_{NEW}$ upon startup as shown at block 1602, and then operation advances to block 1604 in which the newly measured STARTUP$_{NEW}$ is used to update STARTUP using statistical analysis. Many different statistical evaluation techniques are known and contemplated for updating STARTUP over time. Also, any time margin may be added if desired. Operation then advances to block 1606 to wait for the Nth wakeup indicated by WUP(N), and then back to block 1602 to measure the next STARTUP$_{NEW}$ value.

The method of FIG. 16 may also be used to determine STARTUP while the optimal settings 134 are being updated. In this case, the statistical analysis takes into account the value of OPT. While OPT is false, STARTUP errs towards a larger value, and when OPT becomes true, the adjustments may be more tightly controlled. An advantage of the method of FIG. 16 is that the statistics may take into account adjustments being made to the settings along with changes in temperature. In addition, once the optimal settings 134 are finalized, the STARTUP value is dynamically adjusted over time to achieve optimal startup time thereafter, including changes in temperature.

Additional embodiments contemplate a combination of one or more of these techniques shown and described in FIGS. 11-16, in which a user may program one or more settings to select an option. In addition, if the currently determined value of STARTUP becomes inaccurate over time, it may be simply discarded in favor of new STARTUP$_{NEW}$ measurements and STARTUP updates.

Once a STARTUP value is achieved, and a continuous adjusted method is not used, the STARTUP value can be stored in non-volatile memory to be retrieved and used when volatile memory retention is lost. This method may be used when startup is determined in-the-field or during some form of production test. Regardless of when the optimization is preformed, the optimization results can be stored in the memory 110.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. An oscillation circuit that drives an externally coupled crystal to oscillate at a resonant frequency, comprising:
   a crystal interface for coupling to the crystal;
   a crystal amplifier that is coupled to said crystal interface and that drives the crystal to initiate and maintain oscillation, wherein said crystal amplifier has a gain control input;
   a memory;
   a timing circuit;
   a level detector having an input coupled to said crystal interface and having an output, wherein said level detector provides an amplitude indication when an amplitude at said crystal interface achieves a programmable threshold; and
   a controller that activates said crystal amplifier and that controls said crystal amplifier using at least one selected setting including at least one gain setting provided to said gain control input that adjusts a gain of said crystal amplifier, that uses said timing circuit and said level detector to measure a startup time of oscillation at said crystal interface, that calculates startup energy based on said startup time and total current wherein said total current comprises a bias current of said crystal amplifier and remaining system current, and that adjusts said at least one selected setting according to a selected search criterion until at least one optimal setting is determined in which startup energy is minimized.

2. The oscillation circuit of claim 1, wherein said controller adjusts said at least one selected setting for each of a plurality of successive startups, calculates a plurality of startup energy values for said plurality of successive startups, and compares said plurality of startup energy values for determining each of said at least one selected setting that achieves minimal startup energy.

3. The oscillation circuit of claim 1, wherein said at least one gain setting comprises a first gain setting for a first startup phase for establishing oscillation and a second gain setting for a second startup phase for achieving a target amplitude.

4. The oscillation circuit of claim 3, wherein said controller adjusts said first gain setting for each of a plurality of successive startups to minimize startup energy of said first startup phase having a first startup phase time, and adjusts said second gain setting for said each of a plurality of successive startups to minimize startup energy of said second startup phase having a second startup phase time.

5. The oscillation circuit of claim 4, wherein said at least one selected setting comprises an intermediate threshold value and a target threshold value, wherein said controller provides said intermediate threshold to said level detector for determining said first startup phase time, and wherein said controller provides said target threshold to said level detector for determining said second startup phase time.

6. The oscillation circuit of claim 5, wherein said controller adjusts said intermediate threshold for each of a plurality of successive startups to minimize a total startup energy from when said crystal amplifier is activated to when said target amplitude is achieved.

7. The oscillation circuit of claim 1, wherein said controller measures a plurality of startup times for a plurality of startups and determines and stores an optimal startup time used for calculating a wake up time for the oscillation system to wake up from a sleep mode in time to perform an operation at a scheduled time.

8. The oscillation circuit of claim 7, wherein said controller remeasures and updates said optimal startup time upon detecting a temperature change by a predetermined amount.

9. The oscillation circuit of claim 1, wherein when said amplitude indication is not provided within a predetermined timeout period, said controller retrieves robust settings stored in said memory and applies said robust settings to control activating said crystal amplifier for at least one startup before returning to optimal settings.

10. An electronic device, comprising:
    a memory;
    a timing circuit; and an oscillation circuit, comprising:
  a crystal oscillator that establishes oscillation and that has a gain control input;
  a level detector having an input coupled to said crystal and having an output, wherein said level detector provides an amplitude indication when an amplitude at said crystal interface achieves a programmable threshold; and
  a controller that provides a gain setting to said gain control input and that activates said crystal amplifier, that uses said timing circuit and said level detector to measure a new startup time of said crystal oscillator, that calculates a startup energy based on said new startup time, a bias current of said crystal oscillator and remaining system current, that adjusts said gain setting for subsequent startups to determine at least one optimal setting that minimizes startup energy, and that stores said at least one optimal setting in said memory.

11. The electronic device of claim 10, wherein said controller adjusts said gain setting for each of a plurality of successive startups, calculates a plurality of startup energy values for said plurality of successive startups, and compares said plurality of startup energy values for determining a gain setting that minimizes startup energy.

12. The electronic device of claim 10, wherein:
said gain setting comprises a first gain setting applied during a first startup phase for establishing oscillation and a second gain setting applied during a second startup phase for achieving a target amplitude; and
wherein said controller adjusts said first gain setting for each of a plurality of successive startups to minimize startup energy of said first startup phase having a first startup phase time, and adjusts said second gain setting for said each of a plurality of successive startups to minimize startup energy of said second startup phase having a second startup phase time.

13. The electronic device of claim 12, wherein:
said controller programs said threshold of said level detector to an intermediate threshold for said first startup phase, and wherein said controller programs said threshold of said level detector to a target threshold for said second startup phase; and
wherein said controller adjusts said intermediate threshold for each of a plurality of successive startups to minimize a total startup energy from when said crystal amplifier is activated to when said target amplitude is achieved.

14. The electronic device of claim 10, further comprising:
a processor that programs a wakeup circuit with a wakeup value based on a scheduled communication session time and an adjusted startup time; and
wherein said controller determines said adjusted startup time based on a plurality of new startup times.

15. The electronic device of claim 10, wherein when said amplitude indication is not provided within a predetermined timeout period, said controller retrieves robust settings stored in said memory and applies said robust settings to control activating said crystal amplifier for at least one startup before returning to optimal settings.

16. A method of minimizing startup energy of a system that uses a crystal oscillator, comprising:
adjusting a gain level of the crystal oscillator;
measuring a startup time from activation of the crystal oscillator to when an indication is provided indicating that an oscillation signal of the crystal oscillator achieves a target amplitude;
calculating a startup energy of the system based on a bias current level of the crystal oscillator, the startup time, and an other current level representing an amount of remaining current of the system other than the bias current;
repeating said adjusting, said measuring, and said calculating for a plurality of startups to provide a corresponding plurality of startup energy values; and
comparing each newly calculated startup energy value with at least one previously calculated startup energy value until an optimal gain level is determined that achieves a minimum startup energy of the system.

17. The method of claim 16, further comprising:
said adjusting comprising adjusting the gain level for each of a plurality of startup phases of each of the plurality of startups;
setting a threshold of a level detector between each of the plurality of phases;
said measuring comprising measuring a phase startup time of each of the plurality of phases for each of the plurality of startups;
said calculating comprising calculating a startup energy phase value of each of the plurality of phases of each startup based on a phase bias current level, a phase startup time, and the other current level; and
said comparing comprising comparing each newly calculated startup energy phase value with at least one previously calculated startup energy phase value of a corresponding one of the plurality of phases until a plurality of optimal gain levels are determined that achieve a minimum phase energy for each of the plurality of startup phases.

18. The method of claim 17, after determining the optimal gain levels, further comprising:
adjusting the threshold of a level detector between each of the plurality of phases;
repeatedly restarting the crystal oscillator using the optimal gain levels for the plurality of startup phases and the adjusted thresholds between the plurality of phases;
adding a plurality of startup phase energy values for each startup to determine a startup energy value for each of said plurality of startups; and
comparing each newly calculated startup energy value with at least one previously calculated startup energy value until optimal thresholds are determined that achieve a minimum startup energy of the system.

19. The method of claim 16, further comprising:
said measuring a startup time comprising measuring a plurality of startup times;
using said plurality of startup times to determine an adjusted startup time;
storing the adjusted startup time; and
using the stored startup time to determine a delay value for programming a wakeup circuit.

20. The method of claim 17, further comprising:
detecting when the crystal oscillator fails to startup using one of default settings, adjusted settings, and optimal settings;
when the crystal oscillator fails to startup, reactivating the crystal oscillator using robust settings.

* * * * *